United States Patent
Abe et al.

(10) Patent No.: US 9,269,445 B1
(45) Date of Patent: Feb. 23, 2016

(54) SEMICONDUCTOR MEMORY DEVICE

(71) Applicant: KABUSHIKI KAISHA TOSHIBA, Tokyo (JP)

(72) Inventors: Kenichi Abe, Yokohama Kanagawa (JP); Masanobu Shirakawa, Chigasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/634,873

(22) Filed: Mar. 1, 2015

(30) Foreign Application Priority Data

Sep. 17, 2014 (JP) ................................. 2014-188490

(51) Int. Cl.
  *G11C 11/34* (2006.01)
  *G11C 16/04* (2006.01)
  *G11C 16/10* (2006.01)

(52) U.S. Cl.
  CPC ....................................... *G11C 16/10* (2013.01)

(58) Field of Classification Search
  CPC .... G11C 11/34; G11C 16/04; G11C 16/3404; G11C 16/0483; G11C 16/3427; G11C 11/5628
  See application file for complete search history.

(56) References Cited

U.S. PATENT DOCUMENTS

| 2006/0126394 A1* | 6/2006 | Li ....................... G11C 11/5628 365/185.22 |
| 2007/0177431 A1 | 8/2007 | Matsunaga et al. |
| 2010/0061151 A1 | 3/2010 | Miwa et al. |
| 2012/0008408 A1* | 1/2012 | Kim ................... G11C 16/0483 365/185.19 |
| 2013/0058166 A1* | 3/2013 | Maejima ................ G11C 16/10 365/185.18 |
| 2013/0235666 A1 | 9/2013 | Sakamoto et al. |
| 2014/0293693 A1* | 10/2014 | Nam ...................... G11C 16/10 365/185.11 |
| 2015/0049557 A1* | 2/2015 | Watanabe ............. H01L 29/788 365/185.29 |
| 2015/0146489 A1* | 5/2015 | Lee ........................ G11C 16/10 365/185.22 |

FOREIGN PATENT DOCUMENTS

| JP | 2000268583 A | 9/2000 |
| JP | 2007-266143 A | 10/2007 |
| JP | 2008085249 A | 4/2008 |
| WO | 2008011440 A2 | 1/2008 |

* cited by examiner

*Primary Examiner* — Hien Nguyen
(74) *Attorney, Agent, or Firm* — Patterson & Sheridan, LLP

(57) ABSTRACT

A semiconductor memory device includes a first set of memory cells commonly connected to a first word line, a second set of memory cells commonly connected to a second word line, and a control circuit configured to execute a writing operation on the memory cells, including controlling voltages applied to the first and second word lines. The writing operation includes a coarse program operation and a fine program operation and the control circuit executes the writing operation on the first and second sets of memory cells in a single write operation that includes starting the following operations in order: (1) the coarse program operation on the first set of memory cells; (2) the coarse program operation on the second set of memory cells; (3) the fine program operation on the first set of memory cells; and (4) the fine program operation on the second set of memory cells.

20 Claims, 25 Drawing Sheets

FIG. 10
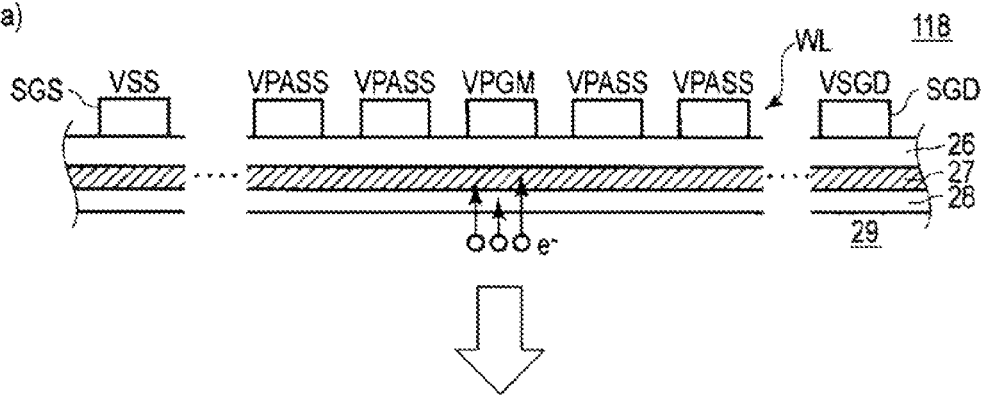
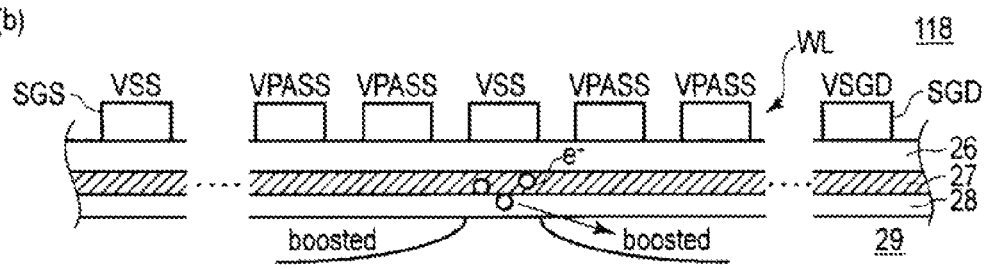
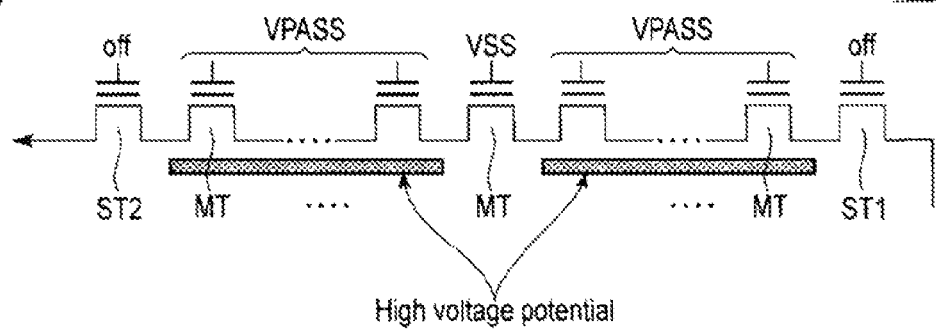

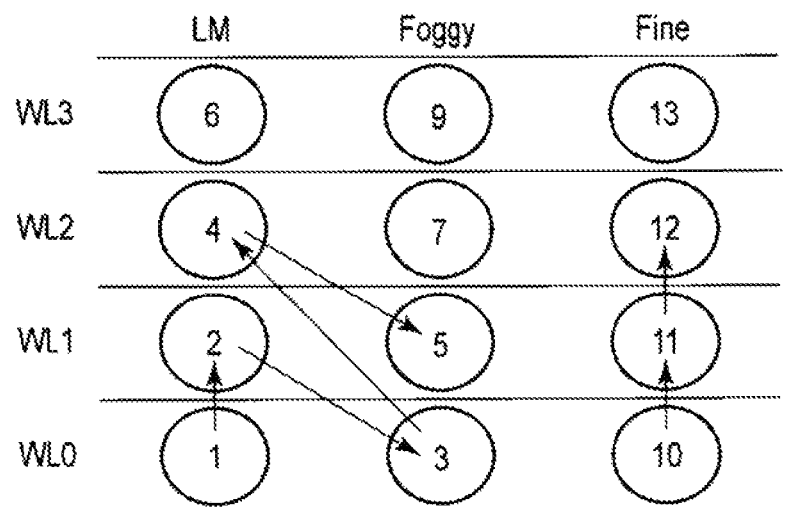
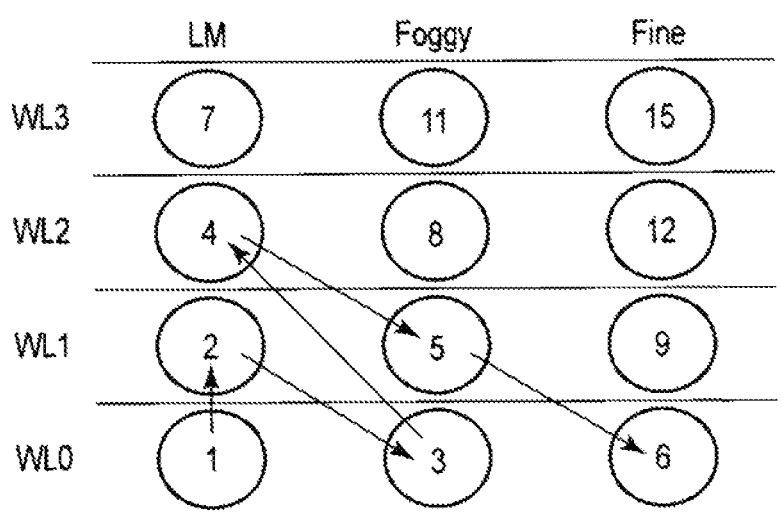

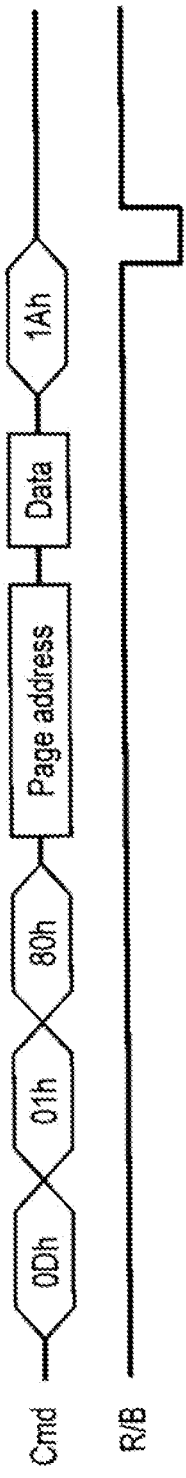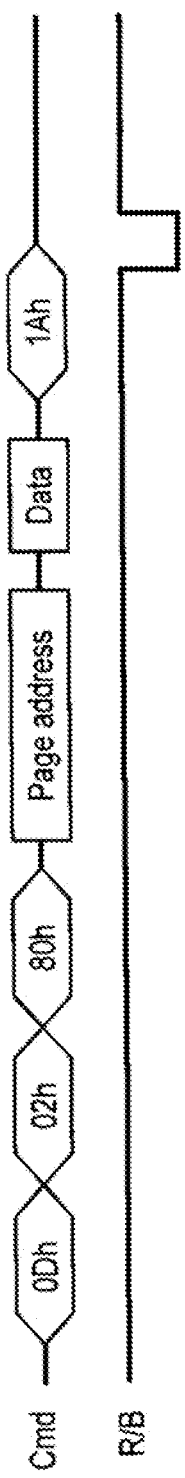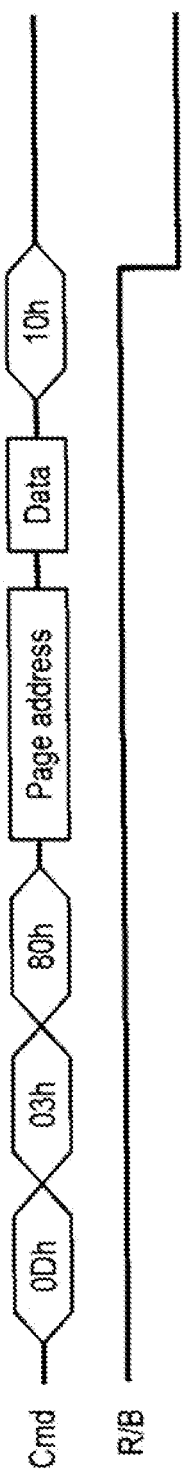

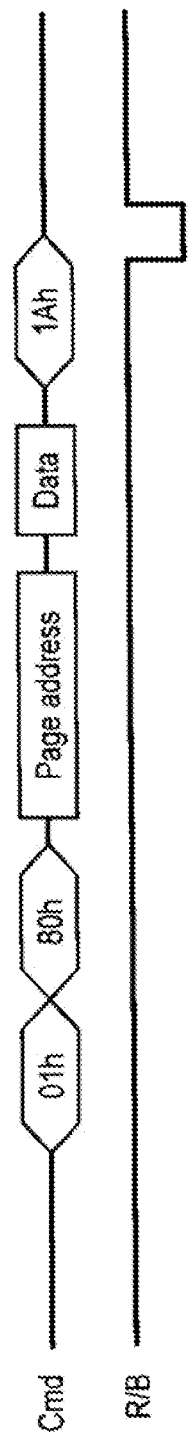
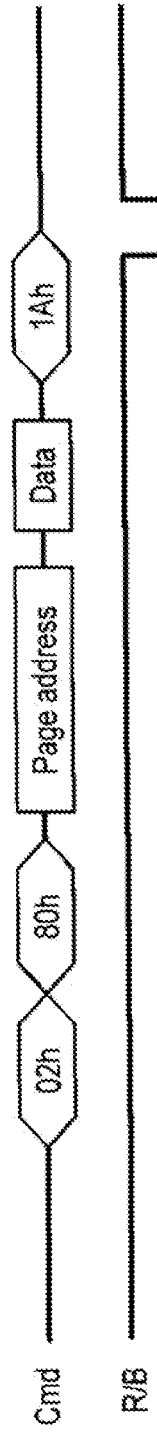
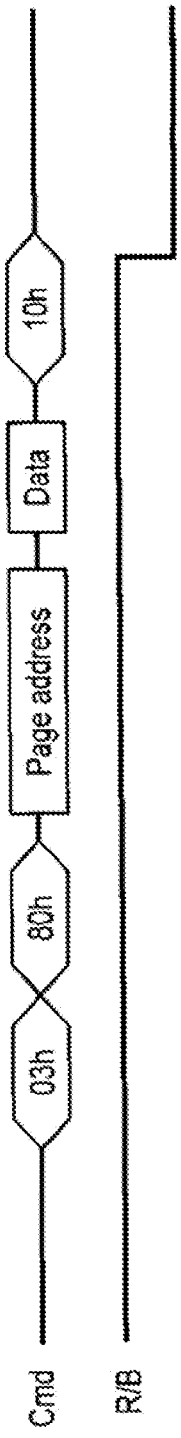
FIG. 17A
FIG. 17B
FIG. 17C

SEMICONDUCTOR MEMORY DEVICE

CROSS-REFERENCE TO RELATED APPLICATION

This application is based upon and claims the benefit of priority from Japanese Patent Application No. 2014-188490, filed Sep. 17, 2014, the entire contents of which are incorporated herein by reference.

FIELD

Embodiments described herein relate generally to a semiconductor memory device.

BACKGROUND

NAND type flash memories having memory cells disposed three-dimensionally are known.

DESCRIPTION OF THE DRAWINGS

FIG. 10 is a diagram schematically illustrating a reverse pulse step implemented in the second embodiment; part (a) of FIG. 10 illustrates a status of a selected NAND string in a Foggy program operation and a Fine program operation, part (b) of FIG. 10 illustrates a status of the selected NAND string during the reverse pulse step, and part (c) of FIG. 10 is a circuit diagram corresponding to part (b) of FIG. 10.

FIGS. 14A and 14B are diagrams illustrating an operation order of a writing operation according to the third embodiment and a comparative example.

FIGS. 16A to 16C are command sequences of a Foggy program operation according to the third embodiment.

FIGS. 17A to 17C are command sequences of a Fine program operation according to the third embodiment.

DETAILED DESCRIPTION

Figure 1:
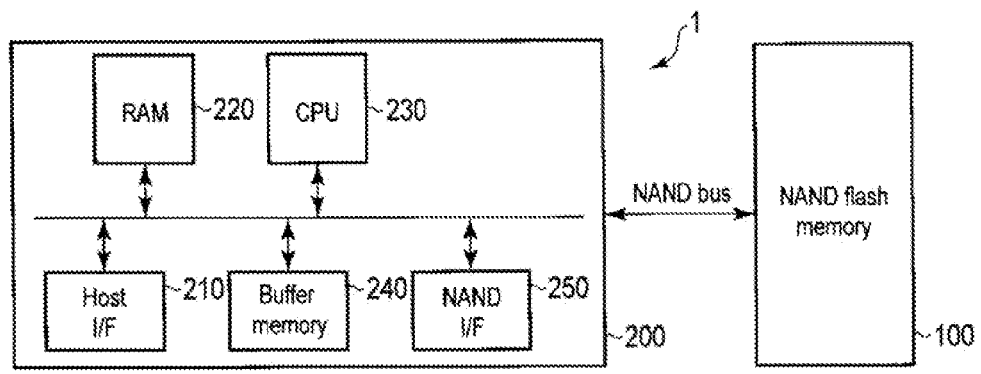
FIG. 1 is a block diagram illustrating a memory system in which embodiments may be implemented.

The present embodiment now will be described more fully hereinafter with reference to the accompanying drawings, in which various embodiments are shown. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to limit the scope of the invention. As used herein, the singular forms "a," "an" and "the" are intended to include the plurality of forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", may therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" may, therefore, encompass both an orientation of above and below.

Embodiments are described herein with reference to cross section and perspective illustrations that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

A semiconductor memory device having an improvement in the reliability of data write is provided.

In general, according to one embodiment, a semiconductor memory device includes a first set of memory cells commonly connected to a first word line, a second set of memory cells commonly connected to a second word line, and a control circuit configured to execute a writing operation on the memory cells, including controlling voltages applied to the first and second word lines. The writing operation includes a coarse program operation and a fine program operation and the control circuit executes the writing operation on the first and second sets of memory cells in a single write operation that includes starting the following operations in order: (1) the coarse program operation on the first set of memory cells; (2) the coarse program operation on the second set of memory cells; (3) the fine program operation on the first set of memory cells; and (4) the fine program operation on the second set of memory cells.

The semiconductor memory device according to the embodiments will be described below with reference to the accompanying drawings. In the accompanying drawings, the same portions are denoted by the same reference numerals and signs. In addition, the repeated description thereof will be given as necessary.

As the semiconductor memory device, a three-dimensionally stacked NAND type flash memory will be described by way of example.

(1) Configuration Example of Semiconductor Memory Device Memory System

A configuration example of a memory system including the semiconductor memory device in which embodiments may be implemented will be described with reference to FIG. 1.

As illustrated in FIG. 1, a memory system 1 includes a NAND type flash memory 100 and a memory controller 200.

The NAND type flash memory 100 includes a plurality of memory cells, and may store data in a non-volatile manner. The detailed configuration of the NAND type flash memory 100 will be described later.

The memory controller 200 commands the NAND type flash memory 100 to perform read, write, erase, and the like in response to a command from an external host device (not illustrated).

The memory controller 200 includes a host interface circuit 210, a built-in memory (RAM) 220, a processor (CPU) 230, a buffer memory 240, and a NAND interface circuit 250.

The host interface circuit 210 is connected to a host device through a controller bus, and is in charge of communication with the host device.

The NAND interface circuit 250 is connected to the NAND type flash memory 100 through a NAND bus, and is in charge of communication with the NAND type flash memory 100.

The CPU 230 controls an operation of the memory controller 200.

The built-in memory 220 is a semiconductor memory such as, for example, a DRAM, and is used as a work area of the CPU 230.

The buffer memory 240 temporarily holds data which is transmitted to the NAND type flash memory 100, and data which is transmitted from the NAND type flash memory 100.

Entire Configuration of NAND Type Flash Memory

Figure 2:
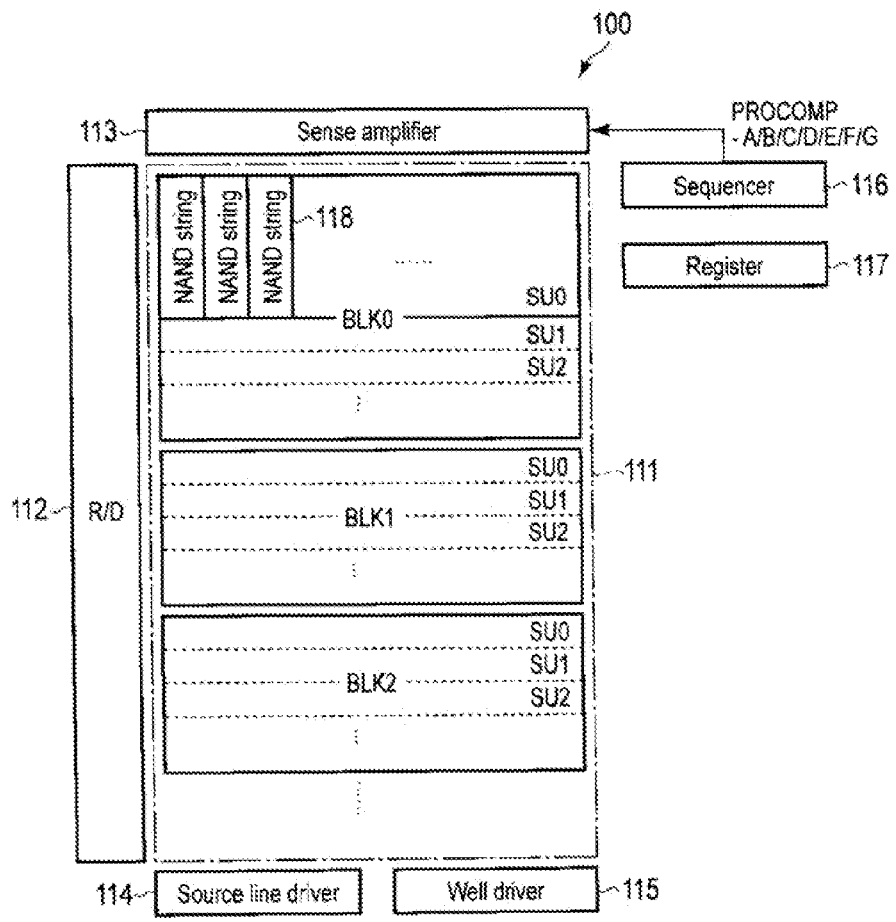
FIG. 2 is a block diagram illustrating a semiconductor memory device in which embodiments may be implemented.

Next, the configuration of the NAND type flash memory 100 will be described with reference to FIG. 2. As illustrated in FIG. 2, the NAND type flash memory 100 includes a memory cell array 111, a row decoder 112, a sense amplifier 113, a source line driver 114, a well driver 115, a sequencer 116 as a control circuit, and a register 117.

The memory cell array 111 includes a plurality of blocks BLK (BLK0, BLK1, BLK2 . . . ). Each of the blocks BLK includes a plurality of string units SU (SU0, SU1, SU2 . . . ). Each of the string units SU includes a plurality of NAND strings 118. Each of the NAND strings 118 includes a plurality of memory cells which are series-connected to each other. The plurality of memory cells are associated with word lines and bit lines, respectively.

The row decoder 112 selects any of the word lines of a corresponding block, and applies an appropriate voltage to a selected word line and a non-selected word line.

The sense amplifier 113 senses and amplifies data which is read in the bit line from the memory cell during reading of data. The sense amplifier 113 transfers writing data to the memory cell during writing of data. Reading and writing of data from and in the memory cell array 111 are performed in units of a plurality of memory cells.

The source line driver 114 applies a voltage to a source line.

The well driver 115 applies a voltage to a well region. The above-mentioned NAND string 118 is disposed in the well region.

The register 117 holds various signals. For example, the register 117 notifies the memory controller 200 of whether operations such as writing and erasing of data are normally completed.

The sequencer 116 controls an operation of the NAND type flash memory 100. Various control signals described below are generated by, for example, the sequencer 116. For example, the sequencer 116 generates signals PROCOMP (PROCOMP-A to PROCOMP-G) indicating the termination of data write, and transmits the generated signals to the sense amplifier 113.

Memory Cell Array

Figure 3:
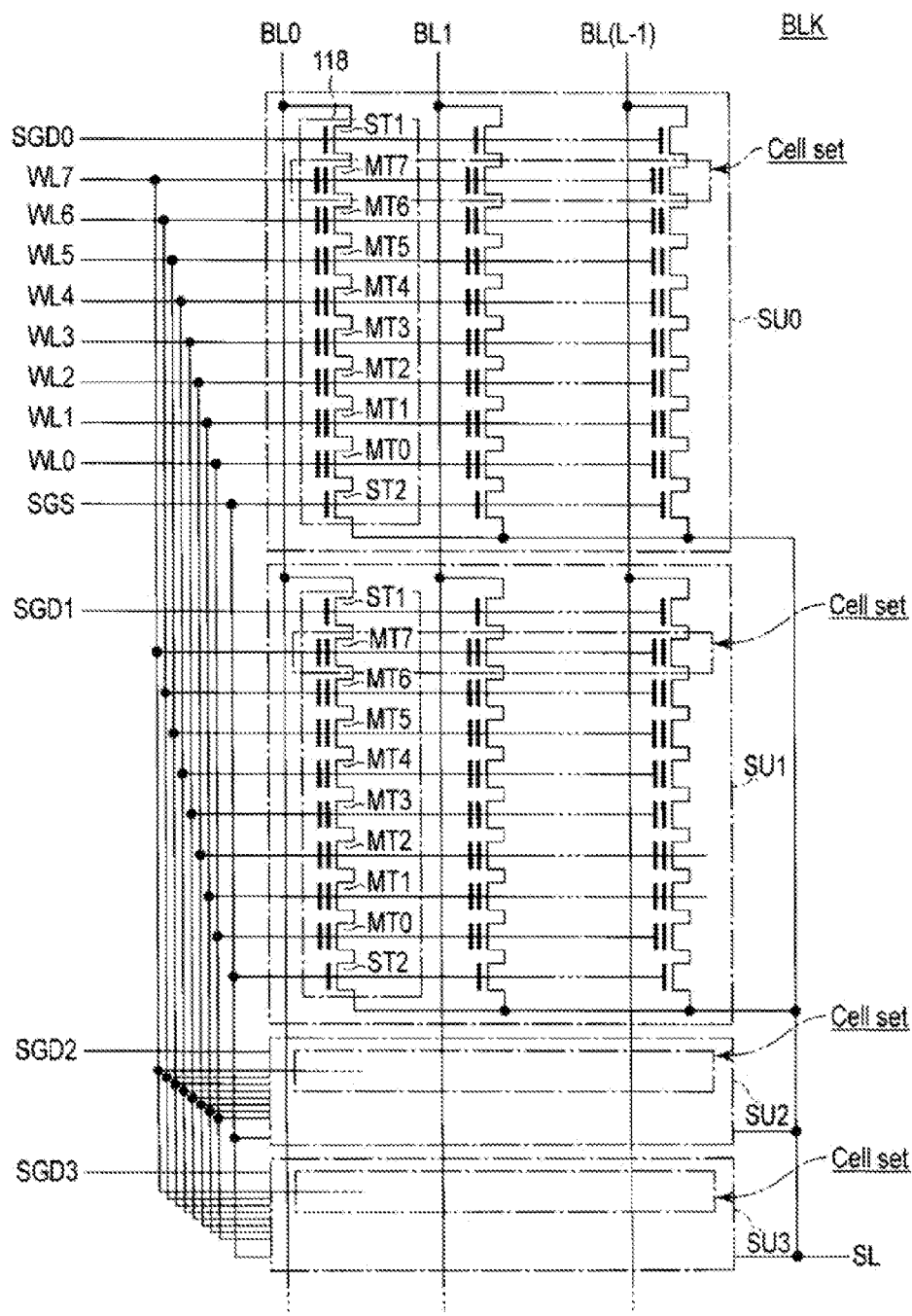
FIG. 3 is a circuit diagram illustrating an example of a memory cell array in which embodiments may be implemented.

Next, the configuration of the memory cell array 111 will be described with reference to FIG. 3. As illustrated in FIG. 3, each of the NAND strings 118 includes a plurality of memory cell transistors MT (MT0 to MT7) and selection gate transistors ST1 and ST2.

Each of the memory cell transistors MT includes a stacked gate. The stacked gate includes a control gate and a charge storage layer. The memory cell transistor MT functions as a memory cell, and may hold data in a non-volatile manner.

The plurality of memory cell transistors MT are disposed between the selection gate transistors ST1 and ST2. These memory cell transistors MT are connected in series to each other. One end of the memory cell transistor MT7 is connected to one end of the selection gate transistor ST1. One end of the memory cell transistor MT0 is connected to one end of the selection gate transistor ST2. In the memory cell array 111, the other end of the selection gate transistor ST1 of the NAND string 118 which is present in the same row is connected in common to one of the bit lines BL (BL0 to BL (L−1)) (2≤L). The other end of the selection gate transistor ST2 is connected in common to a source line SL.

The gate of the selection gate transistor ST1 which is present in a string unit SUn is connected to a selection gate line SGDn (0≤n). The gate of the selection gate transistor ST2 is connected to the same selection gate line SGS between the plurality of string units SU. The control gate of the memory cell transistor MTm which is present in the same block BLK is connected to the word line WLm (0≤m≤7).

Pieces of data of the memory cell transistors MT which are present in the same block BLK are erased, for example, collectively. However, a method of erasing data is not limited thereto, and may be performed, for example, in units smaller than the block BLK. Reading and writing of data are performed collectively with respect to the plurality of memory cell transistors MT included in a set called a "cell set". The cell set is a set including the plurality of memory cell transistors MT which are connected in common to any of the word lines WL in any of the string units SU.

Next, an example of the physical configuration of the memory cell array 111 will be described.

Figure 4:
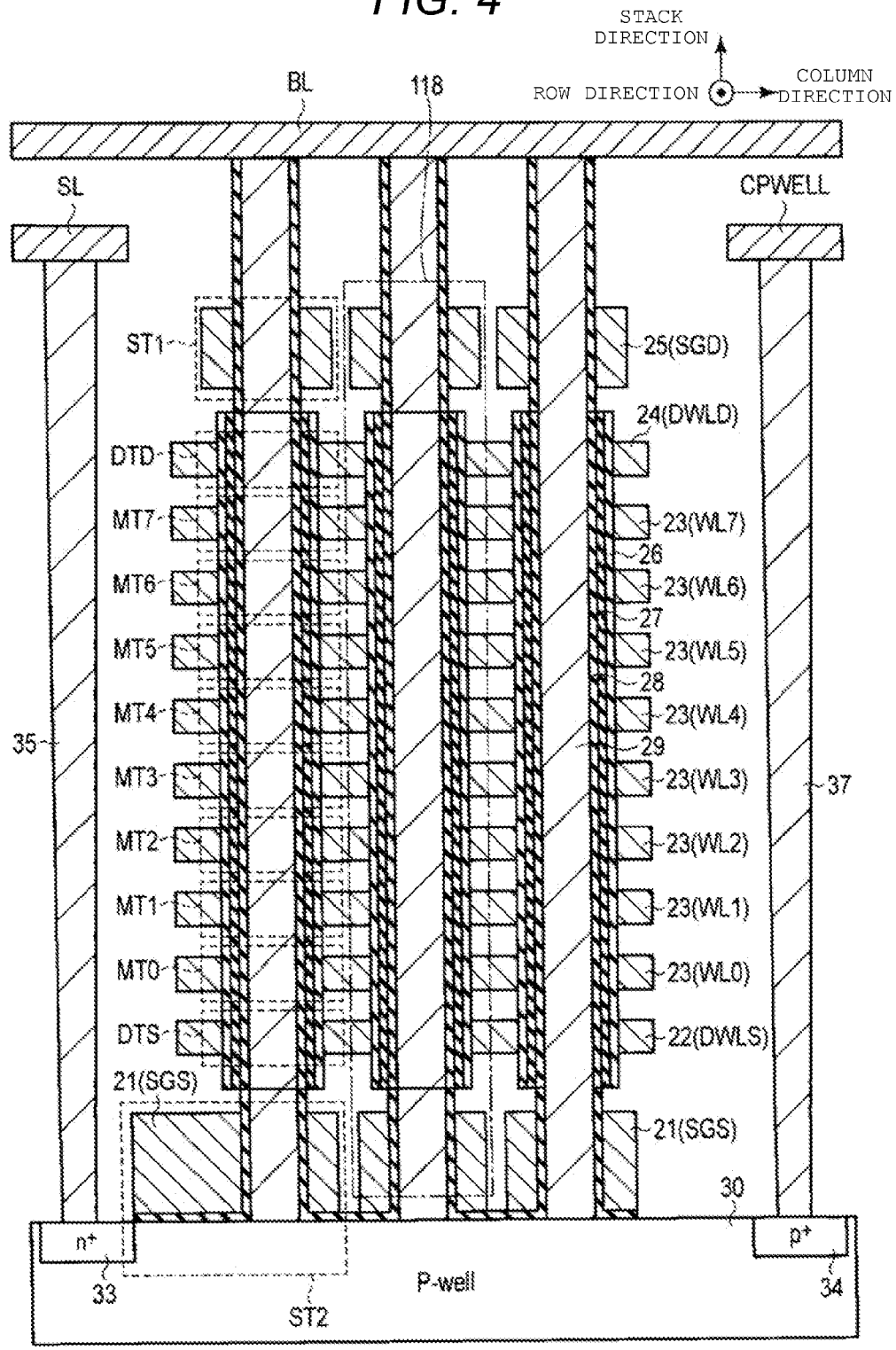
FIG. 4 is a cross-sectional view illustrating the memory cell array of FIG. 4.

As illustrated in FIG. 4, the plurality of NAND strings 118 are disposed above a p-type well region 30.

A wiring layer 21 is disposed above the p-type well region 30. The wiring layer 21 functions as the selection gate line SGS. A wiring layer 22 is disposed above the wiring layer 21. The wiring layer 22 functions as a dummy word line DWLS. A wiring layer 23 is disposed above the wiring layer 22. The wiring layer 23 functions as the word lines WL0 to WL7. A wiring layer 24 is disposed above the wiring layer 23. The wiring layer 24 functions as a dummy word line DWLD. A wiring layer 25 is disposed above the wiring layer 24. The wiring layer 25 functions as a selection gate line SGD. These wiring layers 21 to 25 include a conductive material. An interlayer dielectric film is disposed between these wiring layers 21 to 25.

The wiring layers 22 to 24 and the interlayer dielectric film surround a block insulating layer 26, a charge storage layer 27, a tunnel insulating layer 28, and a silicon pillar 29. The wiring layers 21 and 25 and the interlayer dielectric film surround a tunnel insulating layer 28 and a silicon pillar 29.

The block insulating layer 26 and the charge storage layer 27 extend from a point between the wiring layers 21 and 22 to a point between the wiring layers 24 and 25, in a stack direction. The tunnel insulating layer 28 and the silicon pillar 29 extend in a stack direction, and extend to the p-type well region 30 from the bit line BL. The block insulating layer 26 covers the wiring layers 22 to 24 and the inner surface of the interlayer dielectric film. The charge storage layer 27 covers the inner surface of the block insulating layer 26. The tunnel insulating layer 28 covers the charge storage layer 27, the wiring layers 21 and 25, and the inner surface of the interlayer dielectric film. The silicon pillar 29 is disposed inside the tunnel insulating layer 28.

As described above, the selection gate transistor ST2, dummy transistor DTS, the memory cell transistors MT0 to MT7, a dummy transistor DTD, and the selection gate transistor ST1 are disposed on the p-type well region 30. The silicon pillar 29 functions as the current path of the NAND string 118. The silicon pillar 29 is a region in which a channel is formed during operations of the memory cell transistors MT and the selection gate transistors ST1 and ST2.

The upper end of the silicon pillar 29 is connected to the bit line BL. The bit line BL extends in a column direction, and is connected to the sense amplifier 113.

The surface layer portion within the p-type well region 30 is provided with an $n^+$-type impurity diffusion layer 33 and a $p^+$-type impurity diffusion layer 34. A contact plug 35 is disposed on the $n^+$-type impurity diffusion layer 33. The contact plug 35 extends in a stack direction. The upper end of the contact plug 35 is connected to the source line SL. The source line SL is connected to the source line driver 114. A contact plug 37 is disposed on the $p^+$-type impurity diffusion layer 34. The contact plug 37 extends in a stack direction. The upper end of the contact plug 37 is connected to a well wiring CPWELL. The well wiring CPWELL is connected to the well driver 115.

The tunnel insulating layer 28 is also disposed on the p-type well region 30 between the NAND strings 118 adjacent to each other. The tunnel insulating layer 28 and the selection gate line SGS extend to a region which is close to the $n^+$-type impurity diffusion layer 33. Thereby, a channel which is formed in the selection gate transistor ST2 is connected to the source line SL through the $n^+$-type impurity diffusion layer 33 and the contact plug 35.

A plurality of configurations of FIG. 4 are disposed in a row direction.

(2) Example of Writing Operation of Data

Next, an example of a writing operation of data in the NAND type flash memory 100 will be described with reference to FIGS. 5 to 10.

Threshold Distribution of Memory Cell

First, before a specific example of the writing operation is described, the distribution of threshold voltages of the memory cell transistors MT will be described with reference to FIG. 5.

Figure 5:
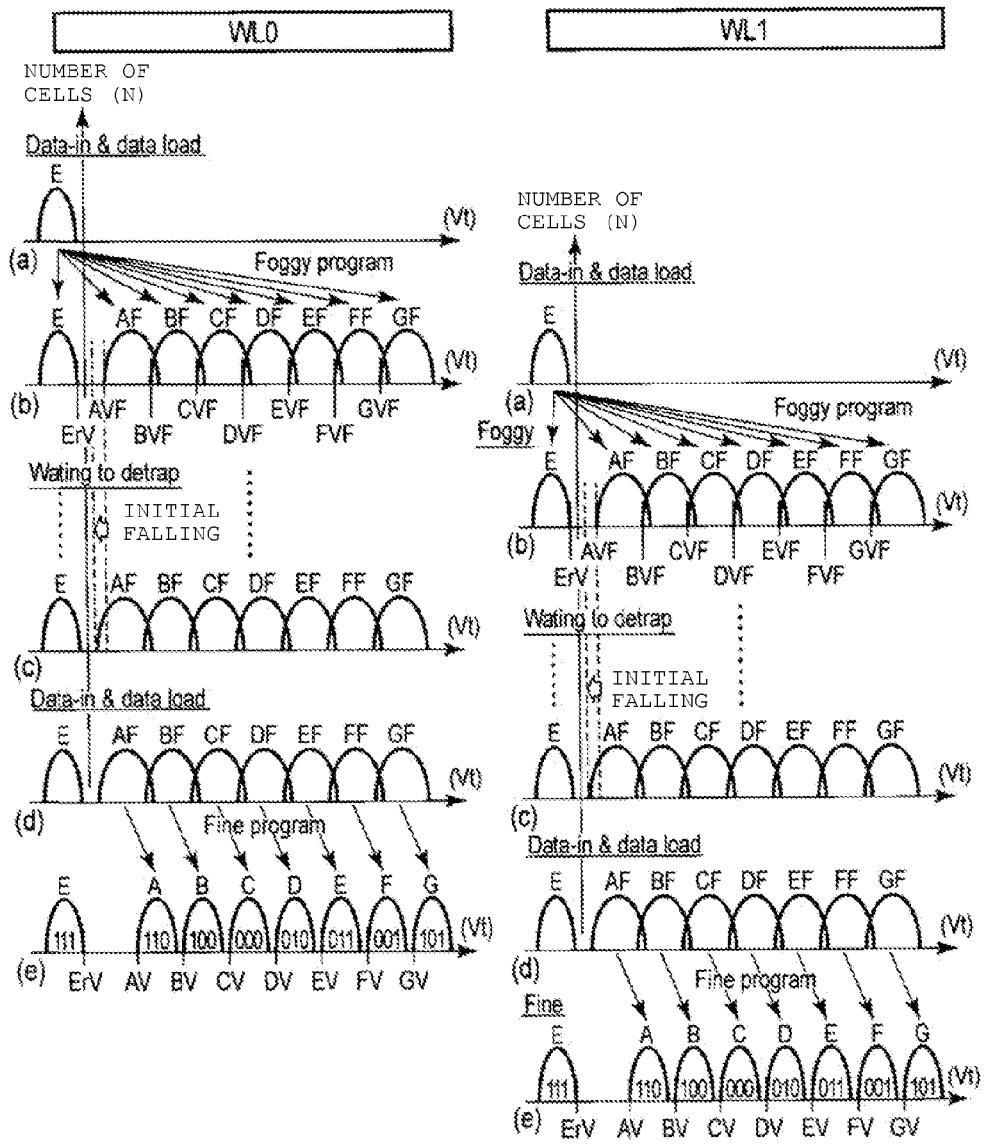
FIG. 5 is a graph illustrating a change in threshold distribution during writing according to a first embodiment.

As illustrated in part (e) of FIG. 5, the plurality of memory cell transistors MT according to the present embodiment may hold data of "111", "110", "100", "000", "010", "011", "001", and "101", for example, in ascending order of threshold voltage. The threshold levels (threshold voltage distributions) of the memory cell transistors MT include an "E" level, and "A" to "G" levels.

The "E" level is the distribution of the threshold voltage in a state where data is erased. The memory cell included in the "E" level is not limited to a memory cell of which the threshold voltage is negative, and may include a memory cell of which the threshold voltage is positive. The "E" level is lower than an erase verify voltage ErV.

The "A" to "G" levels are threshold levels of the memory cell transistors MT in a state where electrons is injected into the charge storage layer 27 (see FIG. 4). For example, the "A"

level is higher than a verify voltage AV, and is lower than a verify voltage BV. The "B" level is higher than the verify voltage BV, and is lower than a verify voltage CV, and so forth. The "G" level is higher than a verify voltage GV.

In this manner, the threshold voltage of the memory cell transistor MT is set to any of eight threshold levels, and thus may store 3-bit data (8-level data).

Foggy Program Operation/Fine Program Operation

Next, a broad concept of method of writing data will be described continuously with reference to FIG. 5. Writing of data is performed on the plurality of memory cell transistors MT by division into, for example, a Foggy program operation as a first operation and a Fine program operation as a second operation. The Foggy program operation and the Fine program operation are executed by the sequencer 116 in accordance with one command.

The Foggy program operation is a writing operation which is performed on the memory cell transistor MT so as to have a threshold distribution wider than a threshold distribution (target threshold distribution) corresponding to writing data. That is, as illustrated in part (b) of FIG. 5, according to the Foggy program operation, the threshold level of the memory cell transistor MT is set to "AF" to "GF" levels having a distribution width greater than the "A" to "G" levels. For example, the "AF" level is higher than a verify voltage AVF, and is lower than a verify voltage BVF. A verify operation for the Foggy program operation is performed using these verify voltages AVF to GVF.

On the other hand, the Fine program operation is an operation for forming a threshold distribution which is a final target by narrowing a relatively wide threshold distribution formed by the Foggy program operation. That is, as illustrated in part (e) of FIG. 5, according to the Fine program operation, the threshold level of the memory cell transistor MT is set to the "A" to "G" levels by narrowing the distribution widths of the "AF" to "GF" levels. For example, the "A" level is higher than the verify voltage AV, and is lower than the verify voltage BV. A verify operation for the Fine program operation is performed using these verify voltages AV to GV.

That is, writing of data is performed in two stages, the threshold level of the memory cell transistor MT is first set to a threshold distribution broader than a target threshold distribution by the Foggy program operation, and is next set precisely to the target threshold distribution by the Fine program operation.

In the present embodiment, such writing of data is performed on any of the cell sets associated with a certain word line WL. In addition, in the present embodiment, one writing operation is performed until writing operations for all the cell sets to be written within, for example, one block BLK are terminated. In this case, it may also be said that the writing operation in the present embodiment is performed in units of a block.

Flow of Writing Operation

Next, a specific flow of the writing operation according to the present embodiment will be described with reference to FIG. 6. In this example, data writing is sequentially performed on all the cell sets to be written within the block BLK.

Figure 6:
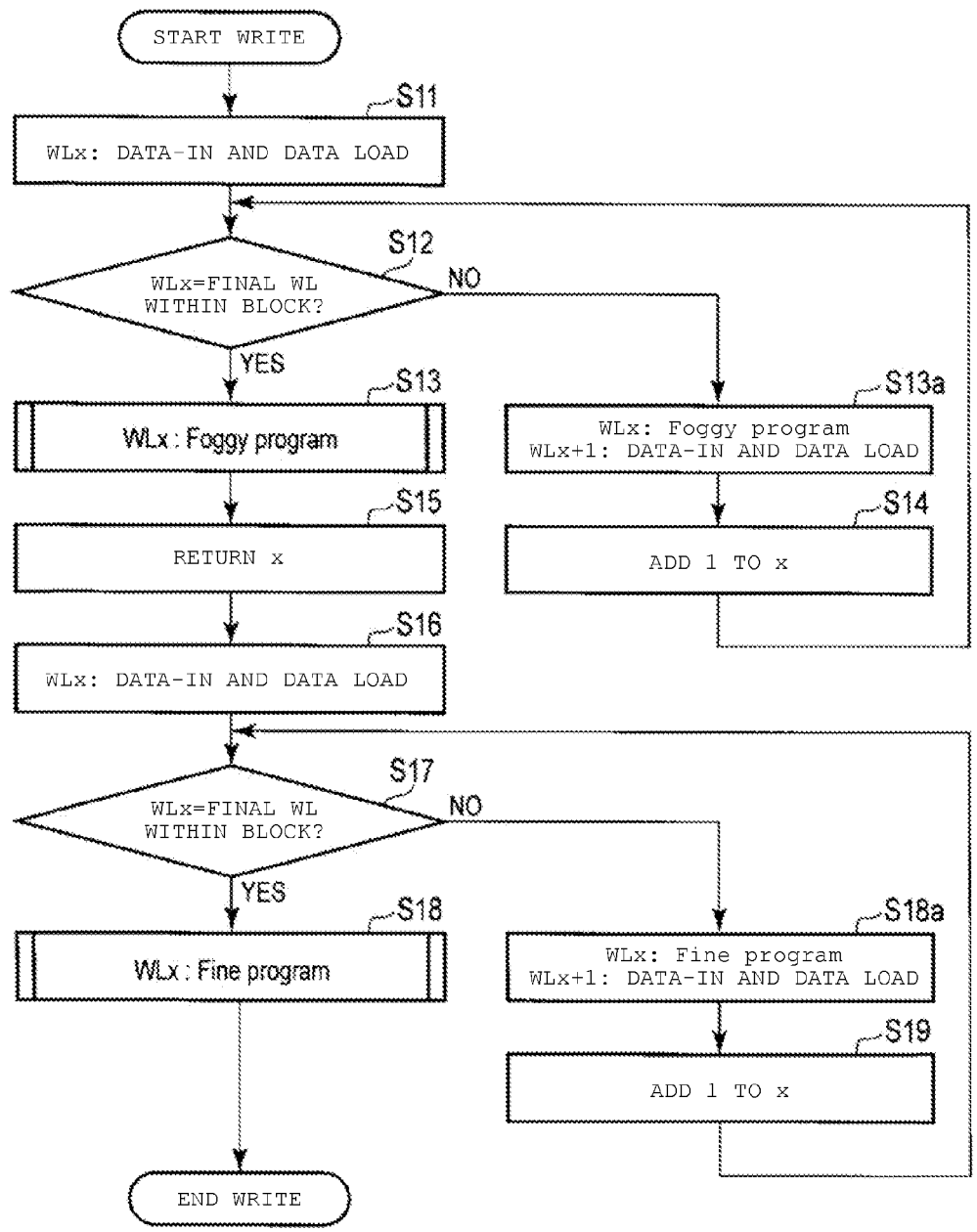
FIG. 6 is a flow diagram illustrating a writing operation according to the first embodiment.

As illustrated in FIG. 6, data is written in order from the memory cell transistor MT on the source side (e.g., from the memory cell transistor MT closest to the selection gate line SGS). Operations described below are mainly performed by the sequencer 116 receiving an instruction from the memory controller 200.

First, in advance of the Foggy program operation, for example, an input/output (IO) buffer (not illustrated) of the NAND type flash memory 100 receives data which is to be written in the cell set of a word line WLx (x is 0 or a positive value) from the memory controller 200. The sequencer 116 loads the data which is held in the IO buffer to a latch circuit of the sense amplifier 113. The latch circuit is provided, for example, for each bit line BL, and is a circuit that holds writing data or read data corresponding to each of the bit lines BL. During writing, the sense amplifier 113 applies a voltage to the bit line BL in accordance with the data which is held in the latch circuit.

In addition, the address of the cell set to be written is provided from the memory controller 200 to the NAND type flash memory 100, and this cell set address is held in, for example, the register 117. Based on this cell set address, the sequencer 116 may determine whether the memory cell transistor MT connected to any of the word lines WL in any of the string units SU is to be written. That is, the word line WLx may be determined.

Subsequently, the sequencer 116 determines whether the word line WLx corresponding to the cell set to be written is a final word line WL (that is, word line WL7 within a final string unit SU in the case of the example of FIG. 3) within the block BLK, using the cell set address within the register 117 (S12).

When the word line WLx is not the final word line WL (S12, NO), the sequencer 116 performs the Foggy program operation on the cell set of the word line WLx. In addition, the IO buffer receives data which is written in the cell set of a word line WLx+1 from the memory controller 200, concurrently with the Foggy program operation. The sequencer 116 loads the data which is held in the IO buffer to the latch circuit of the sense amplifier 113 (S13a). Here, the term "concurrently" indicates that a portion of or the entirety of an execution period of the Foggy program operation with respect to the word line WLx overlaps a portion of or the entirety of an execution period of acquisition and load of data associated with the word line WLx+1.

When the Foggy program operation is terminated, the sequencer 116 increases x by 1 (S14). Thereby, a target for an operation is transferred to the next word line WL, and the process returns to step 12. That is, the sequencer 116 repeats operations steps S12 to S14 until the word line WLx to be written becomes the final word line WL.

When the word line WLx is the final word line WL (S12, YES), the sequencer 116 performs the Foggy program operation on the cell set of the word line WLx (S13). The difference from a case in which the word line WLx is not the final word line is that writing data is not transferred from the controller 200 concurrently with the Foggy program operation of step S13.

Until steps S12 to S14 are repeated, and then step S13 is terminated, the next operation standby is performed sequentially from the cell set of the word line WL in which writing is performed by the Foggy program operation. That is, the memory cell transistor MT which is subjected to the Foggy program operation is configured such that charge is injected into the charge storage layer 27, and has a threshold distribution illustrated in part (b) of FIG. 5.

In this manner, the threshold of the memory cell transistor MT, immediately after the Foggy program operation, may fluctuate. A brief description of this point will be given below. That is, a large number of trap levels may be present in the interface between the charge storage layer 27 and the tunnel insulating layer 28, and the channel of the silicon pillar 29. Charges trapped in the trap level may be easily emitted. Particularly, a trap level having a short time from the trap of charge to the emission thereof (small trap emission time constant) is called a fast trap. After verification in the Foggy program operation from the interface in which the fast trap is present, charge is emitted (detrapped) at, for example, substantially several μ is to several ms.

Therefore, for example, the emission of charge from the charge storage layer 27 while a certain cell set is set to be in the next operation standby results in a drop in the threshold voltage of the memory cell transistor MT which was raised to a certain level by the Foggy program operation (this phenomenon is referred to as "initial falling").

Next, the sequencer 116 returns the value of x to the value of the word line WLx of step S11 (that is, initial value, in other words, value x corresponding to the word line WL which corresponds to the cell set address received from the memory controller 200) (S15).

Subsequently, in advance of the Fine program operation, for example, an IO buffer of the NAND type flash memory 100 receives data which is written in the cell set of the word line WLx from the memory controller 200. The sequencer 116 then loads the data which is held in the IO buffer to the latch circuit of the sense amplifier 113 (S16).

In addition, the address of the cell set to be written is provided from the memory controller 200 to the NAND type flash memory 100, and this cell set address is held in, for example, the register 117. The sequencer 116 determines whether the word line WLx corresponding to this cell set address is the final word line WL within the block BLK (S17).

When the word line WLx is not the final word line WL (S17, NO), the sequencer 116 performs the Fine program operation on the cell set of the word line WLx. In addition, the IO buffer receives data which is written in the cell set of the word line WLx+1 from the memory controller 200, concurrently with the Fine program operation. The sequencer 116 then loads the data which is held in the IO buffer to the latch circuit of the sense amplifier 113 (S18a). When the Fine program operation is terminated, the sequencer 116 increases x by 1 (S19). Thereby, a target for an operation is transferred to the next word line WL, and the process returns to step 17. The sequencer 116 repeats operations of steps S17 to S19 until the word line WLx to be written becomes the final word line WL. Steps S17 to S19 are repeated, and thus the Fine program operation is performed sequentially on the cell set of the word line WL which is set to be in the next operation standby.

When the word line WLx is the final word line WL (S17, YES), the sequencer 116 performs the Fine program operation on the cell set of the word line WLx (S18), and terminates the writing operation.

In the present embodiment, in this manner, a cell set which is associated with a certain word line WLx has a period of operation standby from the time the Foggy program operation is performed to the time the Fine program operation is performed. The operation standby period of the cell set of a certain word line WLx is a period from the time the Foggy program operation for all the cell sets after the word line WLx+1 within the block BLK is completed to the time the Fine program operation for all the cell sets before the word line WLx−1 is completed.

Meanwhile, the order of the word lines WL in which the Foggy program operation and the Fine program operation are performed is set to an ascending order, but is not limited thereto. In one word line WL, when an operation standby time is provided between the Foggy program operation and the Fine program operation, the order of the word lines WL in each of the programs is arbitrary.

With Respect to the Details of Writing and Verification

The details of processes of the Foggy program operation and the Fine program operation will be described with reference to FIG. 7. Both the Foggy program operation and the Fine program operation are performed in accordance with a flow illustrated in FIG. 7. The following operations are mainly performed by the sequencer 116 receiving an instruction from the memory controller 200.

Figure 7:
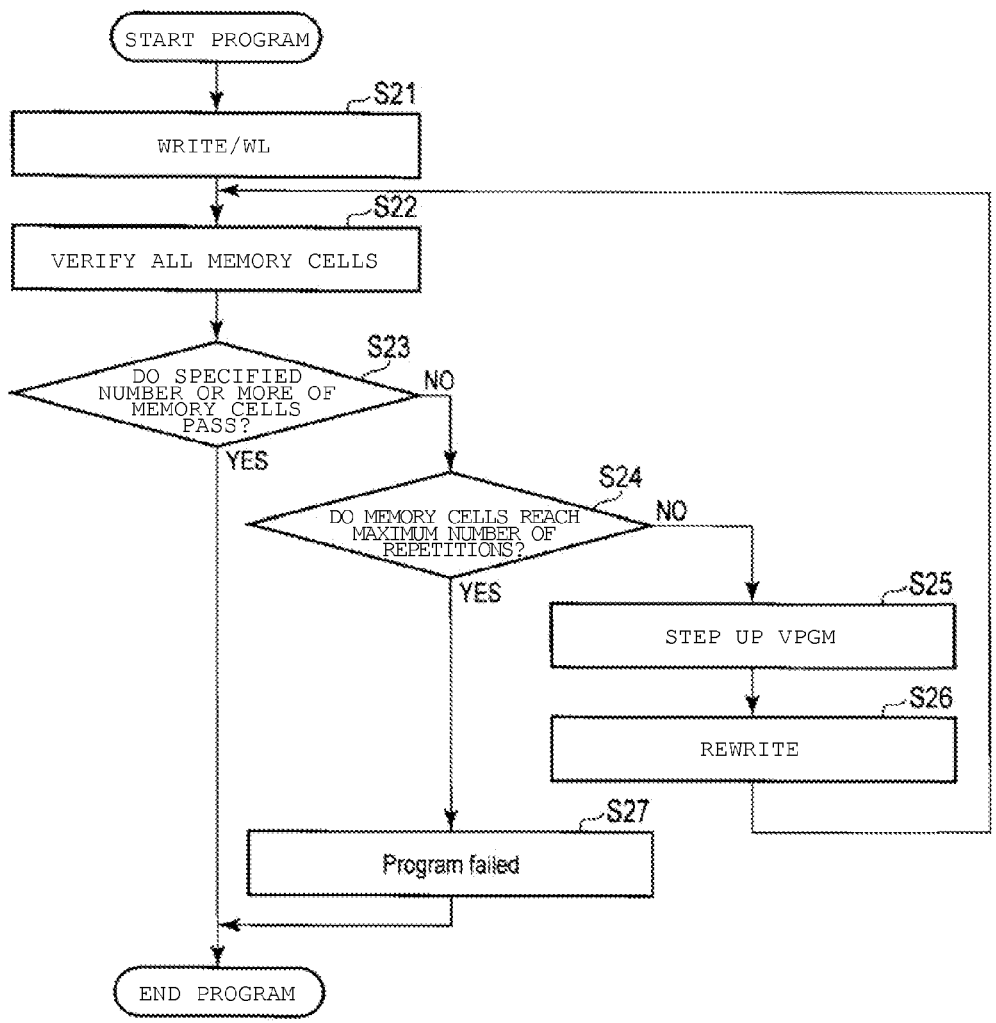
FIG. 7 is a flow diagram illustrating a write and verify operation according to the first embodiment.

As illustrated in FIG. 7, the sequencer 116 first writes data in the memory cell transistor MT in units of a cell set (Foggy write or Fine write) (S21).

Next, the sequencer 116 performs verification (Foggy verification or Fine verification) on the memory cell transistor MT in which data is written in step S21 (S22), and determines whether the specified number or more of memory cell transistors MT pass verification (S23). In the verification, the sequencer 116 reads data from the memory cell transistor MT in which data is written in step S21, and compares an actual threshold voltage of the memory cell transistor MT with a verify voltage. When the threshold voltage of a certain memory cell transistor MT is higher than the verify voltage, the sequencer 116 determines that the memory cell transistor MT passes verification. That is, it is determined that the threshold voltage of the memory cell transistor MT rises to a target write level in the Foggy write or the Fine write. On the other hand, when the threshold voltage of a certain memory cell transistor MT is lower than the verify voltage, the sequencer 116 determines that the memory cell transistor MT fails in verification. That is, it is determined that the threshold voltage of the memory cell transistor MT does not rise to a necessary write level, and is required to further repeat the program.

When the number of memory cell transistors passing verification is equal to or greater than a specified value (S23, YES), the sequencer 116 determines that the writing operation succeeds, and terminates the program.

When the number of memory cell transistors passing verification is less than a specified value (NO), the sequencer 116 determines whether the number of repetitions of a set of writing and verification reaches a maximum value (S24).

When the number of repetitions of writing and verification does not reach the maximum value (S24, NO), the sequencer 116 steps up a voltage VPGM which is applied to the memory cell transistor MT (S25), and performs rewriting in the memory cell transistor MT using this stepped-up voltage VPGM (S26). Operations of steps S22 to S26 are repeated until the number of memory cell transistors passing verification is set to be equal to or greater than the specified value, or the number of repetitions of writing and verification reaches the maximum value. Such repetition of the set of writing and verification is also called a write loop.

When the number of memory cell transistors passing verification is not set to be equal to or greater than the specified value, and the number of repetitions of writing and verification reaches the maximum value (S24, YES), the sequencer 116 terminates the program in program fail (S27). That is, the NAND type flash memory 100 fails in the writing operation.

Figure 8:
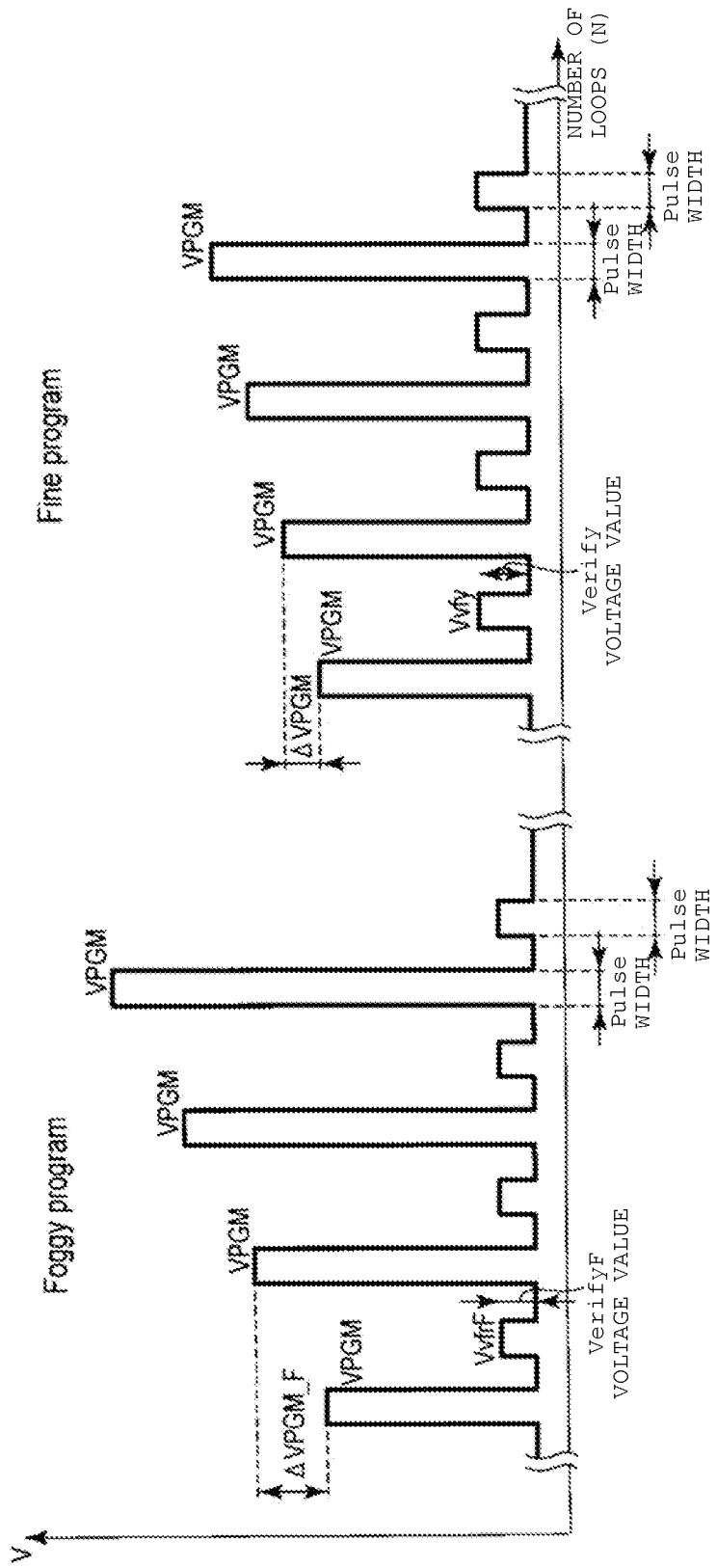
FIG. 8 is a timing diagram illustrating a word line voltage during writing according to the first embodiment.

FIG. 8 illustrates the voltage VPGM and verify voltages VvfyF and Vvfy which are applied to the word line WL during the Foggy program operation and the Fine program operation. The verify voltage VvfyF is a verify voltage corresponding to the Foggy program operation, and is any of the voltages AVF to GVF. In addition, the verify voltage Vvfy is a verify voltage corresponding to the Fine program operation, and is any of the voltages AV to GV.

As illustrated in FIG. 8, in the Foggy program operation, the voltage VPGM and the verify voltage VvfyF are applied to the word line WL alternately repeatedly. In addition, in the Fine program operation, the voltage VPGM and the verify voltage Vvfy are applied to the word line WL alternately repeatedly.

In addition, the pulse width of the voltage VPGM in the Foggy program operation and the pulse width of the voltage VPGM in the Fine program operation are equal to each other, and the pulse width of the voltage Vvfy in the Foggy program operation and the pulse width of the voltage VvfyF in the Fine program operation are equal to each other. Further, an interval at which the voltage VPGM is applied in the Foggy program operation is equal to an interval at which the voltage VPGM is applied in the Fine program operation. The application of these voltages is repeated until the memory cell transistor MT connected to such a word line WL passes verification or reaches the maximum number of repetitions, in each of the programs.

The voltage VPGM is stepped up whenever the number of repetitions increases. The step-up width of VPGM in the Foggy program operation is $\Delta$VPGM_F, and the step-up width of VPGM in the Fine program operation is $\Delta$VPGM. The relation of $\Delta$VPGM_F>$\Delta$VPGM is established.

In addition, when verify voltages corresponding to a certain piece of data are compared with each other, the relation of Vvfy>VvfyF is established. That is, the verify level AV during the Fine program operation, for example, when "110" data is written is larger than the verify level AV during the Foggy program operation. Similarly, a relation of BV>BVF is established, and the relation of GV>GVF is established.

(3) Effect According to the Present Embodiment

According to the present embodiment, the following one or a plurality of effects are exhibited.

(A) According to the present embodiment, the sequencer 116 performs the Foggy program operation on a first cell set, performs the Foggy program operation on a second cell set, performs the Fine program operation on the first cell set, and performs the Fine program operation on the second cell set, in order, in the writing operation.

On the other hand, in, for example, a NAND type flash memory of a comparative example, the Foggy program operation and the Fine program operation are continuously performed on a cell set which is associated with one word line. Thereafter, the Foggy program operation and the Fine program operation are performed in the next word line, and Foggy program operation and the Fine program operation are further performed in the next word line.

However, in such a write method, during the Fine program operation, or after the verification of the Fine program operation, the threshold voltage of the memory cell may be initially fallen down as described above. Thereby, the distribution of the threshold voltage has a width larger than a specified width, and thus may not be able to be corrected by ECC. In addition, verification is seldom passed due to the occurrence of initial falling during verification, and thus a program time may be lengthened.

In this regard, in the present embodiment, the Fine program operation is not immediately performed, after the Foggy program operation, on a certain cell set (first cell set) which is associated with one word line WL, and the Foggy program operation (and/or the Fine program operation) is performed on a separate cell set. Therefore, the first cell set is set to be in a left-behind state (state of the next operation standby) for a period of a program for this separate cell set, and the initial falling of the threshold voltage occurs in the meantime.

In this manner, the left-behind state is set before the Fine program operation is started, and thus the Fine program operation may be performed in a state where the initial falling is terminated, at least to some extent. Thus, it is possible to suppress an increase in the number of repetitions of the write loop or the occurrence of program fail, due to the occurrence of the initial falling during the Fine program operation.

In addition, it is possible to inhibit the threshold voltage from dropping after verification in the Fine program operation is passed, and data which is held by the memory cell from changing to an erroneous value.

As described above, according to the present embodiment, it is possible to writing data more accurately while suppressing the spread of the distribution width of the threshold voltage of the memory cell. In addition, the number of times of the write loop during the Fine program operation is reduced, thereby allowing a program time to be shortened.

(B) When writing of data is performed in two stages of the Foggy program operation and the Fine program operation, cell set data used during the Foggy program operation is naturally required during the Fine program operation. Therefore, when the Foggy program operation is attempted to be first performed on, for example, ten word lines WL, and the Fine program operation is attempted to be next performed on the ten word lines WL, the sense amplifier is required to hold cell set data corresponding to a maximum of tens word lines when considered simply (specifically, when it is assumed that data is written in order of the word lines WL0 to WL9, cell set data for the word lines WL0 to WL9 is required to be held during the execution of the Fine program operation of the word line WL0).

However, according to the present embodiment, when the Fine program operation is executed with respect to each of the word lines WL, the cell set data is received from the memory controller 200 again. Therefore, the sense amplifier 113 is not required to hold cell set data until the Fine program operation is executed. Thus, it is possible to achieve the present embodiment without increasing the number of latch circuits to be prepared for the sense amplifier 113.

Next, a semiconductor memory device implementing a write according to a second embodiment will be described.

The second embodiment is different from that in the first embodiment, in that a step of promoting initial falling after the Fine program operation (hereinafter, this is called a reverse pulse step) is inserted. The second embodiment is implemented in the same configuration of the NAND type flash memory 100 and the memory system 1 in which the first embodiment was implemented. The following operations are mainly performed by the sequencer 116 receiving an instruction from the memory controller 200.

(1) With Respect to Concept of Reverse Pulse Step

In a writing operation of the present embodiment, the sequencer 116 inserts the reverse pulse step, for example, one time, after the termination of the Fine program operation. In this reverse pulse step, the sequencer 116 applies an electric field to the tunnel insulating layer 28 of the memory cell transistor MT in an opposite direction to that during a program operation. Thereby, a fluctuation in threshold after the Fine program operation is suppressed by promoting initial falling after the Fine program operation.

(1) Example of Writing operation of Data

Figure 9:
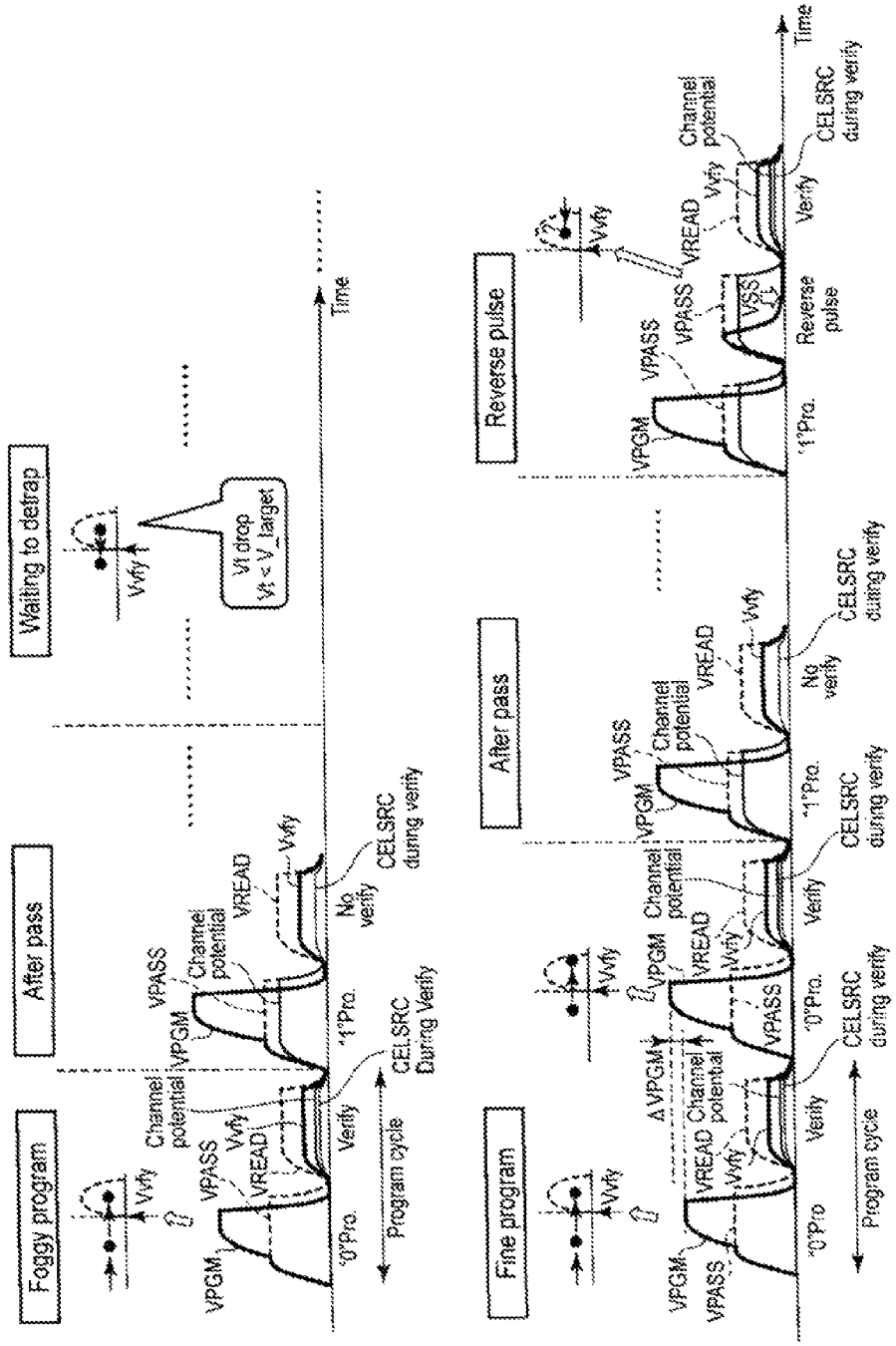
FIG. 9 is a timing diagram illustrating various signals during writing according to a second embodiment.

A method of writing data according to the present embodiment will be described below in detail. FIG. 9 illustrates a time change of a word line voltage during writing of data according to the present embodiment, solid-line waveforms drawn by thick line illustrate potentials of selected word lines WL, and broken-line waveforms drawn by thick line illustrate, similarly, potentials of non-selected word lines WL. In addition, one of waveforms of two solid lines drawn by thin lines illustrates a channel potential of a non-selected memory cell transistor MT, and the other waveform illustrates a potential of a source line SL during verification of a selected memory cell transistor MT. Parts (a) to (c) of FIG. 10 are cross-sectional views and circuit diagrams of a selected NAND string during the program and during the reverse pulse step.

As illustrated in FIGS. 9 and 10, during the Foggy program operation, the row decoder 112 applies a voltage VSGD to the selection gate line SGD in accordance with a command of the sequencer 116, and turns on the selection gate transistor ST1 of the selected NAND string 118. In this manner, in a state where the selection gate line SGD is selected, the sequencer 116 applies the voltage VPGM to the selected word line WL, and applies a voltage VPASS to the non-selected word line WL. Meanwhile, the voltage VPASS is a voltage for turning on the memory cell transistor MT regardless of retention data, and is a voltage for raising a channel potential by coupling described later. In addition, the voltage VPGM is a voltage which is applied to the word line WL when charge is injected into the charge storage layer by FN tunneling, and the relation of VPGM>VPASS is established. Further, by the sense amplifier 113 applying 0 V to the bit line BL, the channel potential of the silicon pillar 29 is set to, for example, 0 V. As described above, electrons e⁻ are injected into the charge storage layer 27 of the selected memory cell transistor MT by the voltage VPGM, and writing is performed.

Subsequently, in a state where the row decoder 112 turns on the selection transistors ST1 and ST2 in response to the command of the sequencer 116, the verify voltage Vvfy is applied to the selected word line WL, and a voltage VREAD is applied to the non-selected word line WL. The voltage VREAD is a voltage for turning on the memory cell transistor MT regardless of retention data. Thereby, the sense amplifier 113 reads data of the selected memory cell transistor MT. The sequencer 116 repeats the above-mentioned writing and verification until the threshold voltage of the selected memory cell transistor MT reaches a target value, or until program fail. Verification is passed in order from the memory cell transistor MT which is written at a lower threshold level of the "AF" to "GF" levels.

In the NAND string 118 including the memory cell transistor MT in which the verification is passed, the sequencer 116 turns off the selection gate transistor ST1, for example, when the voltage VPGM is applied. Thereby, until writing in the memory cell transistor MT in which the verification is not passed is terminated, the sequencer 116 does not perform writing in the memory cell transistor MT in which the verification is passed. In addition, for example, when the voltage Vvfy is applied, the sequencer 116 does not read data from the memory cell transistor MT in which the verification is passed, and does not verify such a memory cell transistor MT.

When the verification during the Foggy program operation is terminated, the selected memory cell transistor MT is set to be in a state of the next operation standby. As described in the first embodiment, charge is emitted during this operation standby, and thus the threshold voltage may initially fall down.

Even during the Fine program operation, similarly to the Foggy program operation, the sequencer 116 performs writing in the selected memory cell transistor MT. The sequencer 116 verifies writing data. In addition, the sequencer 116 repeats the writing and verification until the threshold voltage of the selected memory cell transistor MT reaches a target value, or until program fail.

The sequencer 116 does not perform writing data in the memory cell transistor MT in which the verification is passed, until writing in the memory cell transistor MT in which the verification is not passed is terminated. In the timing of verification, the sequencer 116 does not verify data of such a memory cell transistor MT.

Whenever the Fine program operation for a certain threshold level is terminated, the sequencer 116 transmits the signal PROCOMP to the sense amplifier. For example, when the Fine program operation is succeeded with respect to a specified number or more of selected memory cell transistors MT which are written at the "A" level, the sequencer 116 transmits the signal PROCOMP-A to the sense amplifier. The sequencer 116 terminates the Fine program operation with respect to all the threshold levels, and performs the reverse pulse step when the signals PROCOMP-A to PROCOMP-G are transmitted.

That is, the sequencer 116 performs the reverse pulse step for each word line. In the reverse pulse step, the sequencer 116 sets the potential of the bit line BL to VDD (for example, positive voltage). Subsequently, the sequencer 116 performs control so as to cut off the voltage VSGD after the selected transistor ST1 transfers the potential of the bit line BL to a channel.

In this manner, the sequencer 116 applies the voltage VPASS to the non-selected word line WL in a state where the selection gate transistor ST1 is turned off. Further, the sequencer 116 apples a voltage VSS (for example, 0 V) to the selected word line WL. This state is in a reverse magnitude relation of the voltages which are applied to these selected and non-selected word lines WL during writing.

By the voltage being applied as stated above, in the non-selected memory transistor MT, the channel which is formed in the silicon pillar 29 is set to be in an electrically floating state, and the potential thereof rises to substantially VPASS by coupling with the non-selected word line WL. On the other hand, in the selected memory cell transistor MT, the channel is not formed. As a result, an electric field in an opposite direction to that during writing is applied to the tunnel insulating layer 28 of the selected memory cell transistor MT. Electrons e⁻ trapped in the tunnel insulating layer 28 of the selected memory cell transistor MT, and the like are attracted to the channel of the non-selected memory cell transistor MT by such an electric field and the channel potential of the non-selected memory cell transistor MT. As a result, the trapped electrons e⁻ are emitted from the tunnel insulating layer 28 and the like.

After the reverse pulse step, the sequencer 116 performs the verification of the selected memory cell transistor MT, and performs the Fine program operation again when the verification is not passed. When the verification is passed, the writing operation is terminated.

Meanwhile, the reverse pulse step after the Fine program operation is not limited to one time, and may be performed, for example, two times or more.

(2) Effect According to the Second Embodiment

According to the second embodiment, in addition to the effects of the first embodiment, the following one or a plurality of effects are exhibited.

(A) According to the second embodiment, after the writing operation is terminated, the channel potential of the non-selected memory cell transistor MT belonging to the selected NAND string 118 is raised by the reverse pulse step, and, for example, VSS is applied to the selected word line WL. In this manner, the reverse pulse step is performed after the Fine program operation is terminated, and thus it is possible to promote initial falling after the Fine program operation. Thereafter, the verification is further performed, and rewriting is performed appropriately, thereby allowing the final threshold voltage of the memory cell transistor MT to be set to a desired value.

(B) According to the second embodiment, one reverse pulse step is performed after the Fine program operation is terminated. Thereby, it is possible to set the final threshold voltage to a desired value without lengthening the time of the writing operation.

For example, in a writing operation of a comparative example, the Foggy program operation and the Fine program operation are continuously performed. In the Fine program operation, initial falling caused by the Foggy program operation may continue to occur. In the Fine program operation, initial falling caused by the Fine program operation may also occur. In order to solve the initial falling, it is considered that the reverse pulse step is inserted, and the like, before verification, for example, for each Foggy program operation and Fine program operation.

On the other hand, in the second embodiment, each memory cell transistor MT is set to be in a state of operation standby after the Foggy program operation is terminated. Thereby, as described in the first embodiment, a time at which initial falling caused by the Foggy program operation occurs in the meantime is secured. For this reason, when the Fine program operation is started, initial falling caused by the Foggy program operation is terminated at least to some extent. Thus, in the Fine program operation, only initial falling caused by the Fine program operation may be promoted by the reverse pulse step. For the purpose thereof, for example, the reverse pulse step may be performed, for example, one time after the Fine program operation is terminated. Thus, for example, as compared to the above-mentioned comparative example, it is possible to shorten the time of the writing operation. In addition, a disturbance is reduced as compared to a case where the reverse pulse is performed every time.

(3) Modification Example of the Second Embodiment

A semiconductor memory device in which a modification example of the second embodiment is implemented, will be described with reference to FIGS. 11 and 12.

Figure 11:
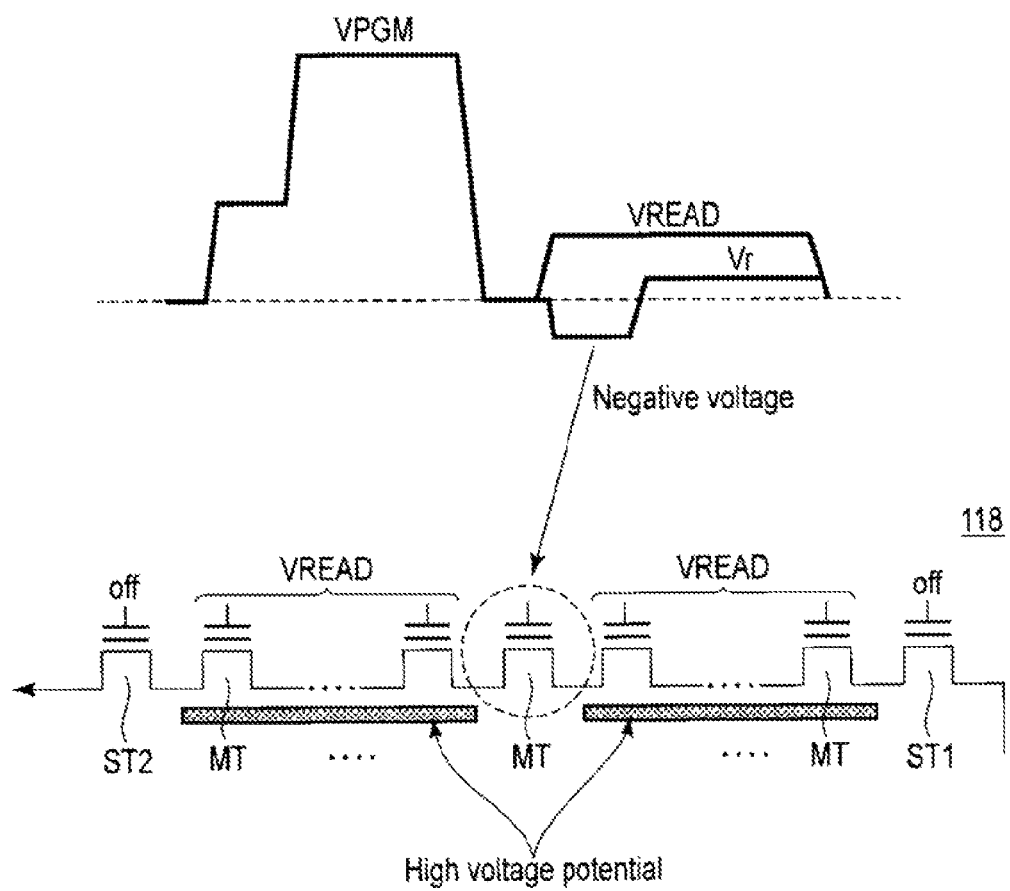
FIG. 11 is a diagram schematically illustrating a negative voltage application step implemented in a modification of the second embodiment.

The modification example of FIG. 11 is an example in which initial falling is promoted by a step different from the reverse pulse step described in the second embodiment. In the following, this step is called a negative voltage application step, and only points which are different from those in the second embodiment will be described.

As illustrated in FIG. 11, a sequencer 116 according to this modification example applies the voltage VREAD to the non-selected word line WL in a state where the selection gate transistors ST1 and ST2 are turned off, in the negative voltage application step. The sequencer 116 applies a negative voltage to the selected word line WL. Thereby, the negative voltage is applied to the tunnel insulating layer 28 of the selected memory cell transistor MT, and electrons e⁻ trapped in the tunnel insulating layer 28 and the like are emitted. Since the selection gate transistors ST1 and ST2 are turned off, the channel of the non-selected memory cell transistor MT rises in potential due to the voltage VREAD. The emission of the electrons e⁻ from the tunnel insulating layer 28 is also promoted by the trapped electrons e⁻ being attracted to the channel having a rise in potential.

In this manner, for example, a triple well structure may be used in applying the negative voltage to the tunnel insulating layer 28 of the memory cell transistor MT, and a negative voltage generation circuit may be connected from, for example, the outside of the NAND type flash memory 100. The triple well is disposed in a semiconductor substrate, and the memory cell transistor MT is disposed above the triple well. The triple well includes a first well, a second well in the first well, and a third well in the second well. A voltage is applied to the memory cell transistor MT located above the triple well, and thus the emission of the trapped electrons e⁻ is promoted.

Figure 12:
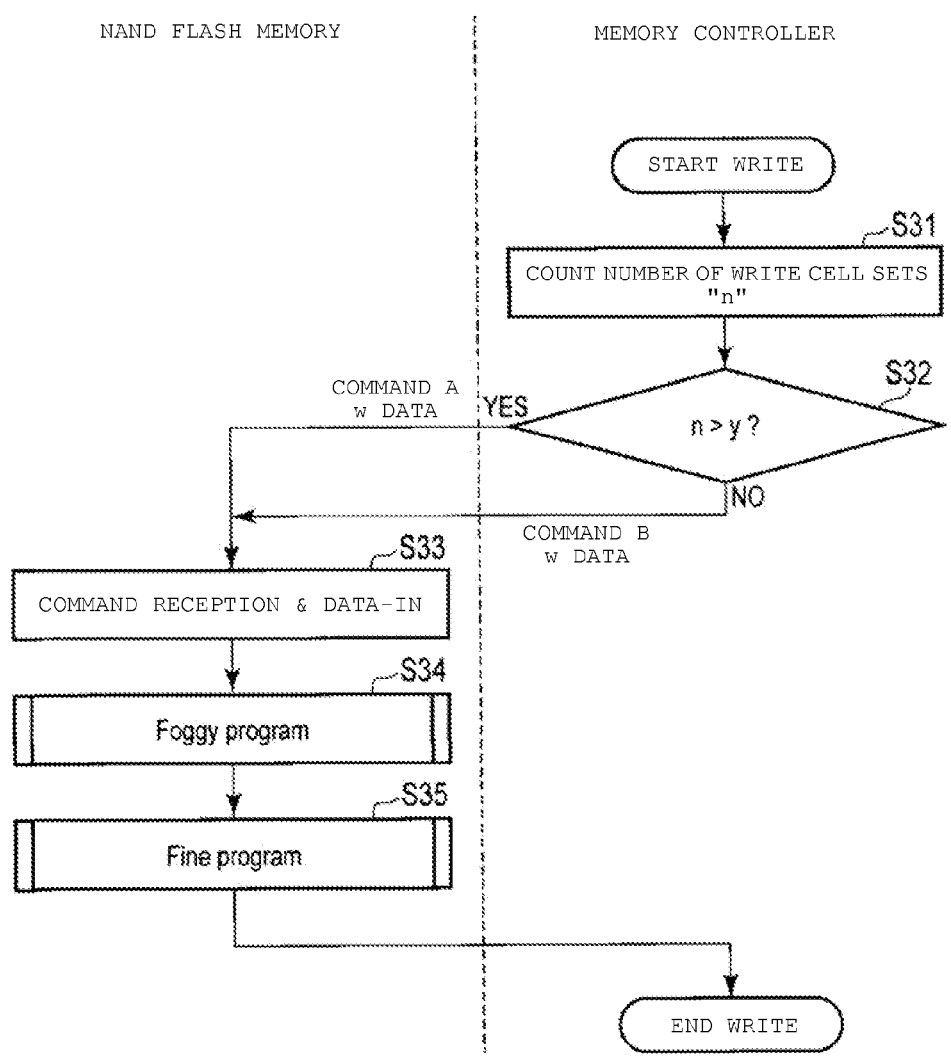
FIG. 12 is a flow diagram illustrating a writing operation according to the modification of the second embodiment.

FIG. 12 illustrates another modification example. The modification example of FIG. 12 is different from that in the second embodiment, in that whether the reverse pulse step is inserted before verification for each Fine program operation may be selected.

As illustrated in FIG. 12, when the NAND type flash memory 100 is caused to start the writing operation, the memory controller 200 counts the number of cell sets n on which writing is performed (S31).

When the number of write cell sets n is greater than a certain value y which is held by the memory controller 200, the memory controller 200 transmits a command A. When the number of write cell sets n is equal to or less than a certain value y, the memory controller 200 transmits a command B (S32). A certain value y will be described later. The command A gives an instruction for a program in which each memory cell is set to be in a state of operation standby after the Foggy program operation is terminated. The command B gives an instruction for a program in which the reverse pulse step is performed, for example, before verification for each Fine program operation. Instead thereof, or in addition thereto, the reverse pulse step may be performed before verification for each Foggy program operation.

The memory controller 200 transfers the command A or the command B to the NAND type flash memory 100, along with writing data (S33). Thereafter, the NAND type flash memory 100 performs the Foggy program operation and the Fine program operation in accordance with the selected command A or command B (S34 and S35).

According to this modification example, when the number of write cell sets n is sufficiently large (n>y), a sufficient time is secured with respect to individual memory cells after the Foggy program operation is terminated, and thus the reverse pulse step is not performed. However, when the number of write cell sets n is excessively small (n≤y), a time at which individual memory cells are set to be in operation standby after the Foggy program operation is terminated is excessively short, and thus there is the possibility of not securing a sufficient time at which initial falling occurs. Consequently, for example, the Foggy program operation and the Fine program operation are continuously performed, and instead, initial falling is promoted by the reverse pulse step. The value y is determined so that a time required for the Foggy program operation of y cell sets becomes longer than a time required for initial falling caused by the Foggy program operation to occur.

In this manner, according to this modification example, it is possible to select more efficient commands A and B, from time to time, in accordance with the degree of the number of write cell sets n, and to shorten the time of the writing operation.

Meanwhile, in this modification example, the negative voltage application step may be performed instead of the reverse pulse step.

Next, a writing of a semiconductor memory device according to a third embodiment will be described with reference to FIGS. 13 to 17C.

The third embodiment is different from that in the above-mentioned embodiments, in that an LM program operation (Lower-Middle program operation) is performed in addition to the Foggy program operation and the Fine program operation.

The third embodiment is implemented in the same configuration of the NAND type flash memory 100 and the memory system 1 in which the first and second embodiments were implemented. The following operations are mainly performed by the sequencer 116 receiving an instruction from the memory controller 200.

A cell set used as a unit of the writing operation may be further divided into a Lower page, a Middle page, and an Upper page. The Lower page is a page in which low-order bit data is written. The Middle page is a page in which middle-order bit data is written. The Upper page is a page in which high-order bit data is written. In this manner, three pages are allocated to the storage space of the memory cell which is connected to one word line WL.

(1) Example of Writing operation of Data

A writing operation according to the present embodiment will be described with reference to FIG. 13. As illustrated in part (a) of FIG. 13, the LM program operation as a third operation is performed on a memory cell which is in an erased state, in addition to the first operation (Foggy program operation) and the second operation (Fine program operation) described in the first embodiment, and thus data of a threshold voltage having an "LM" level is written as illustrated in part (b) of FIG. 13. During writing at the LM level, the voltage VPGM is applied to the word line WL. Whenever the LM program operation is repeated, the voltage VPGM is stepped up. This step-up width may be the same as the above-mentioned $\Delta VPGM\_F$, and may be larger or smaller than the $\Delta VPGM\_F$.

The threshold voltage of the "LM" level is higher than a verify voltage LMV, is higher than at least the voltage AVF, and is lower than the voltage GVF. In verification in the LM program operation, the voltage LMV is used as a verify voltage. Thereby, the threshold level of the memory cell is set to any of the "E" level and the "LM" level.

Figure 13:
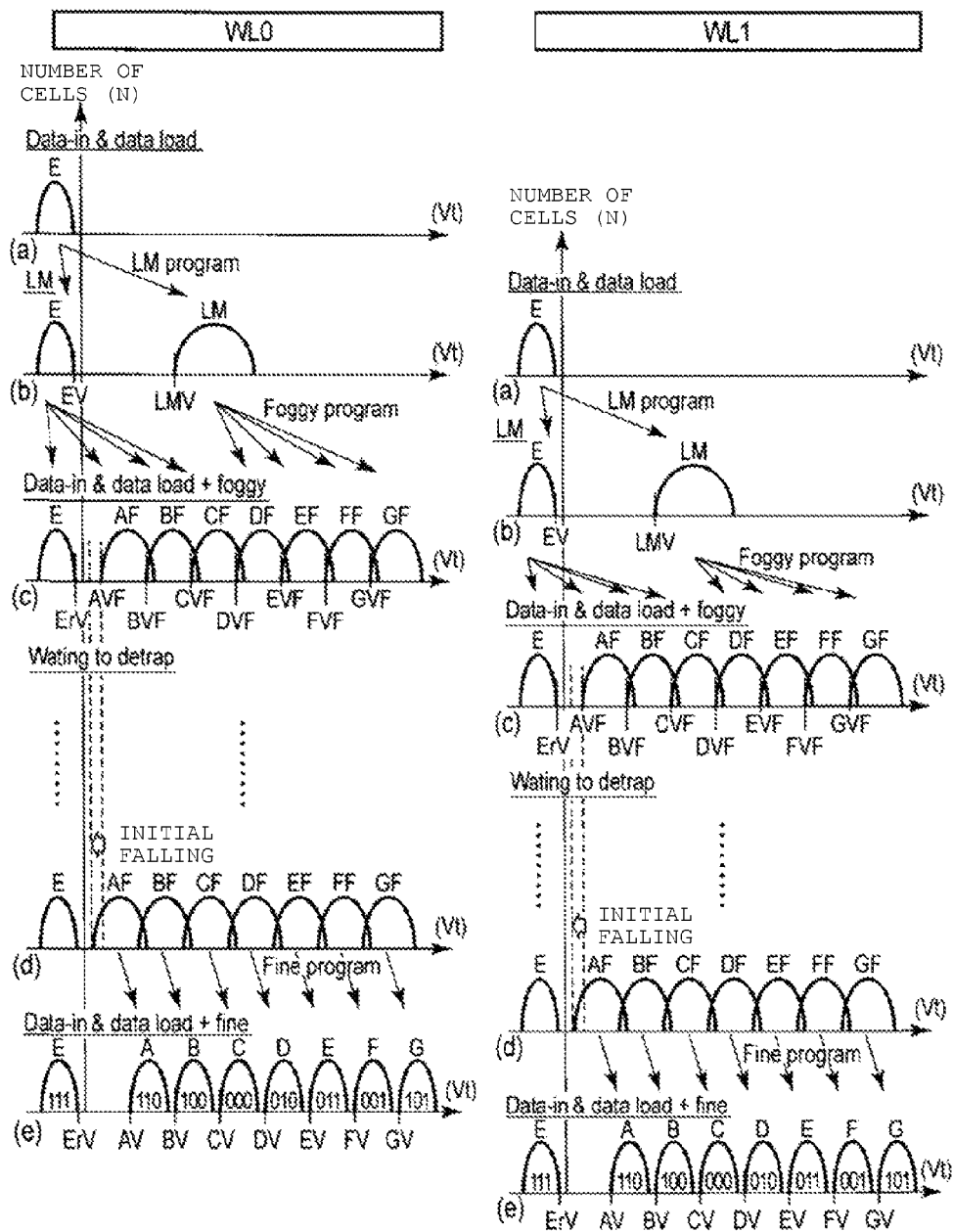
FIG. 13 is a graph illustrating a change in threshold distribution during writing according to a third embodiment.

As illustrated in FIGS. 13 and 14A, in the third embodiment, the sequencer 116 continuously performs the LM program operation and the Foggy program operation on a cell set which is associated with each word line WL. In an operation order at this time, for example, the LM program operation is performed on the word line WLx (for example, WL1 in FIGS. 14A and 14B), the Foggy program operation is then performed on the word line WLx−1 (same WL0), the LM program operation is then performed on the word line WLx+1 (same WL2), and the Foggy program operation is then performed on the word line WLx (same WL1).

Data which is written in the cell set of the word line WL is acquired from the memory controller 200, every time, before each program is performed. For example, the IO buffer of the NAND type flash memory 100 acquires data which is written in the cell set of the word line WLx−1 from the memory controller 200, concurrently with a case where the LM program operation is performed on the cell set of the word line WLx. The sequencer 116 loads such data to the latch circuit of the sense amplifier 113. The TO buffer acquires data which is written in the cell set of the word line WLx+2 from the memory controller 200, concurrently with a case where the Foggy program operation is performed on the cell set of the word line WLx. The sequencer 116 loads such data to the latch circuit.

In this manner, regarding all the word lines WL within the block BLK, the sequencer 116 performs the LM program operation of the cell set associated therewith, and the Foggy program operation. In the meantime, a state of the next operation standby is performed from the cell set in which the Foggy program operation is terminated. The operation standby period of the cell set of a certain word line WLx is a period until the LM program operation and the Foggy program operation for all the cell sets after the word line WLx+1 within the block BLK are completed, and the Fine program operation for all the cell sets before the word line WLx−1 is completed.

When the above operation is terminated with respect to all the word lines WL, the sequencer 116 starts the Fine program operation. In an operation order at this time, for example, the Fine program operation is performed on the word line WLx, and then the Fine program operation is performed on the word line WLx+1.

The data which is written in the cell set of the word line WL is acquired from the memory controller 200, every time, before the Fine program operation is performed. For example, while the Fine program operation is performed on the cell set of the word line WLx, the IO buffer acquires data which is written in the cell set of the word line WLx+1 from the memory controller 200. The sequencer 116 loads such data to the latch circuit.

In this manner, regarding all the word lines WL within the block BLK, the Fine program operation of the cell set associated therewith is performed on such data.

As described above, the writing operation according to the present embodiment is performed.

Meanwhile, the order of the word lines WL in which the LM program operation and the Foggy program operation are performed is not limited to the above example. In one word line WL, when an operation standby time is provided between the Foggy program operation and the Fine program operation, the execution order of the LM program operation and the Foggy program operation is arbitrary.

As illustrated in FIG. 14B, in a comparative example, continuously, the LM program operation is performed on the cell set of the word line WLx+1, the Foggy program operation is then performed on the cell set of the word line WLx, and then the Fine program operation is performed on the cell set of the word line WLx−1.

In this manner, in the comparative example, in one word line WL, an operation standby time is not provided between the Foggy program operation and the Fine program operation.

(2) Command Sequence

Next, reference will be made to FIGS. 15A to 17C to describe the sequence of commands which are transmitted and received on a NAND bus between the memory controller 200 and the NAND type flash memory 100 during the LM program operation, the Foggy program operation, and the Fine program operation according to the present embodiment.

The sequence of the LM program operation and the Foggy program operation illustrated in FIGS. 15A to 15C and FIGS. 16A to 16C is configured based on the command sequence of the Fine program operation illustrated in FIGS. 17A to 17C.

As illustrated in FIGS. 17A to 17C, when writing in a plurality of pages associated with one word line WL is performed, the memory controller 200 affixes a prefix for specifying a page before a command 80h for giving an instruction for a program operation.

As illustrated in FIG. 17A, the memory controller 200 transmits a prefix command 01h on an I/O line, and transmits the command 80h. The prefix command 01h specifies the Lower page. The memory controller 200 transmits an address, data, and a command 1Ah, subsequently to the command 80h. The address specifies a cell set including a selected memory cell. The set of the selected memory cell provides the storage space of a page to be written. The command 1Ah is transmitted in place of a command 10h. The command 10h gives an instruction for the start of writing. When multi-bit writing is performed per memory cell, data of such a bit number has to be transferred. The sequencer 116 of the NAND type flash memory 100 does not start writing even when the command 1Ah is received, and waits for data of other bits being transferred. Since writing is not started, the NAND type flash memory 100 is set to be in a busy state only for a short time, and then returns to a ready state immediately.

As illustrated in FIG. 17B, the memory controller 200 also transmits the same signal as that of FIG. 17A with respect to the Middle page. The memory controller 200 transmits a prefix command 02h instead of the prefix command 01h. The prefix command 02h specifies the Middle page. An address and data are the same as the address and the data of FIG. 17A.

As illustrated in FIG. 17C, the memory controller 200 further transmits the same signal as that in FIGS. 17A and 17B with respect to the Upper page. The memory controller 200 transmits a prefix command 03h instead of the prefix commands 01h and 02h. The prefix command 03h specifies the Upper page. An address and data are the same as the address and the data in FIGS. 17A and 17B. The memory controller 200 transmits the command 10h instead of the command 1Ah. When the command 10h is received, the NAND type flash memory 100 starts writing in the Lower page, the Middle page, and the Upper page. The NAND type flash memory 100 outputs a busy signal during writing, and stops outputting the busy signal when writing is terminated.

The LM program operation and the Foggy program operation are specified using the prefix commands based on the command of the Fine program operation.

Figure 15A:
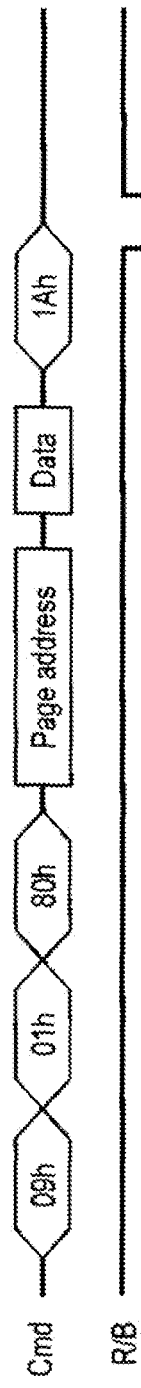
FIGS. 15A to 15C are command sequences of an LM program according to the third embodiment.
Figure 15B:
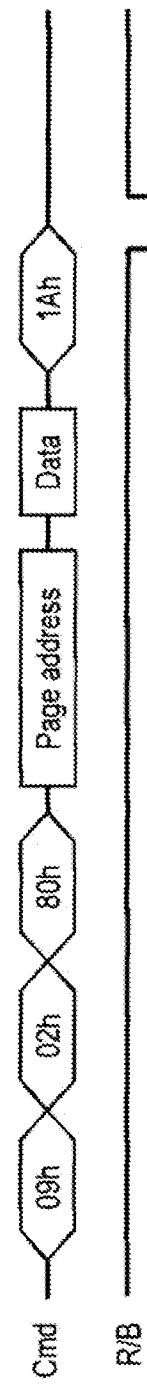
Figure 15C:
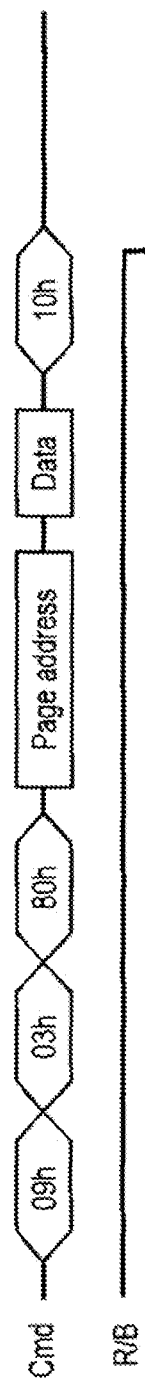

In the command sequence of the LM program operation, as illustrated in FIGS. 15A to 15C, the memory controller 200 provides, for example, a prefix command 09h at the head. In the command sequence of the Foggy program operation, as illustrated in FIGS. 16A to 16C, the memory controller 200 provides, for example, a prefix command 0Dh at the head.

(3) Effect According to the Present Embodiment

According to the present embodiment, after the LM program operation is performed, the Foggy program operation and the Fine program operation are performed. Thereby, the following effects are exhibited in addition to the effects of the above-mentioned embodiment.

A distance between the memory cells adjacent to each other is reduced with a reduction in the size of the NAND type flash memory. Thereby, a proximity effect (Yupin effect) tends to occur. The term "proximity effect" as used herein refers to a phenomenon in which a threshold voltage is shifted due to interference between the memory cells adjacent to each other during data writing, or the distribution width of the threshold voltage becomes larger.

According to the present embodiment, the LM program operation is performed ahead of the Foggy program operation and the Fine program operation, thereby allowing the proximity effect to be suppressed.

The writing operations according to the embodiments and the modification examples mentioned above may also be applied to a semiconductor memory device having configurations other than the one described above.

(1) Configuration Example of Semiconductor Memory Device

A semiconductor memory device, e.g., a NAND type flash memory, having a different configuration will be described with reference to FIGS. 18 to 23.

A NAND type flash memory having this other configuration is different from that described above, in that a memory cell array having a configuration different from that of the memory cell array 111 in FIGS. 3 and 4 is implemented. The other configurations are the same as those of the NAND type flash memory 100 and the memory system 1.

Figure 18:
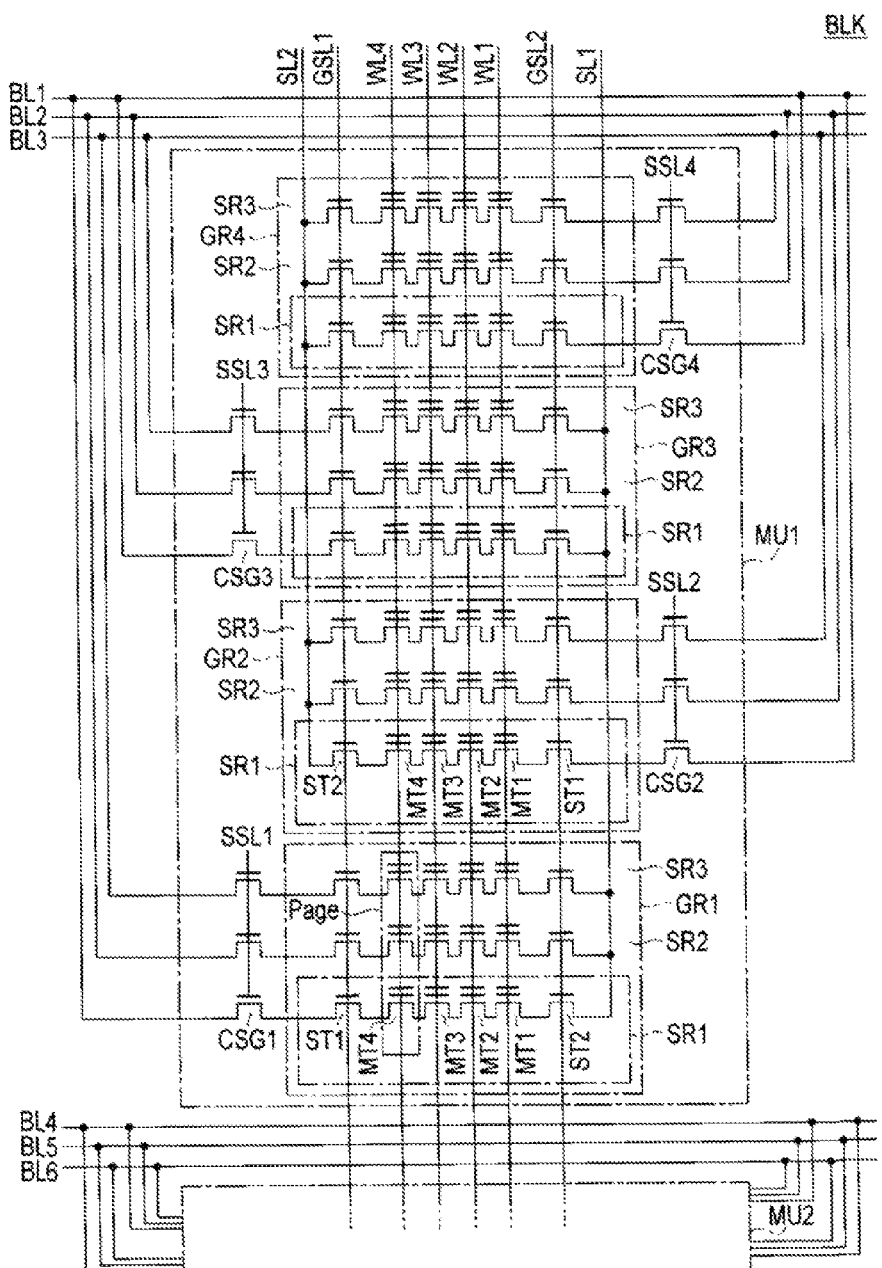
FIG. 18 is a circuit diagram illustrating another example of a memory cell array in which embodiments may be implemented.
Figure 19:
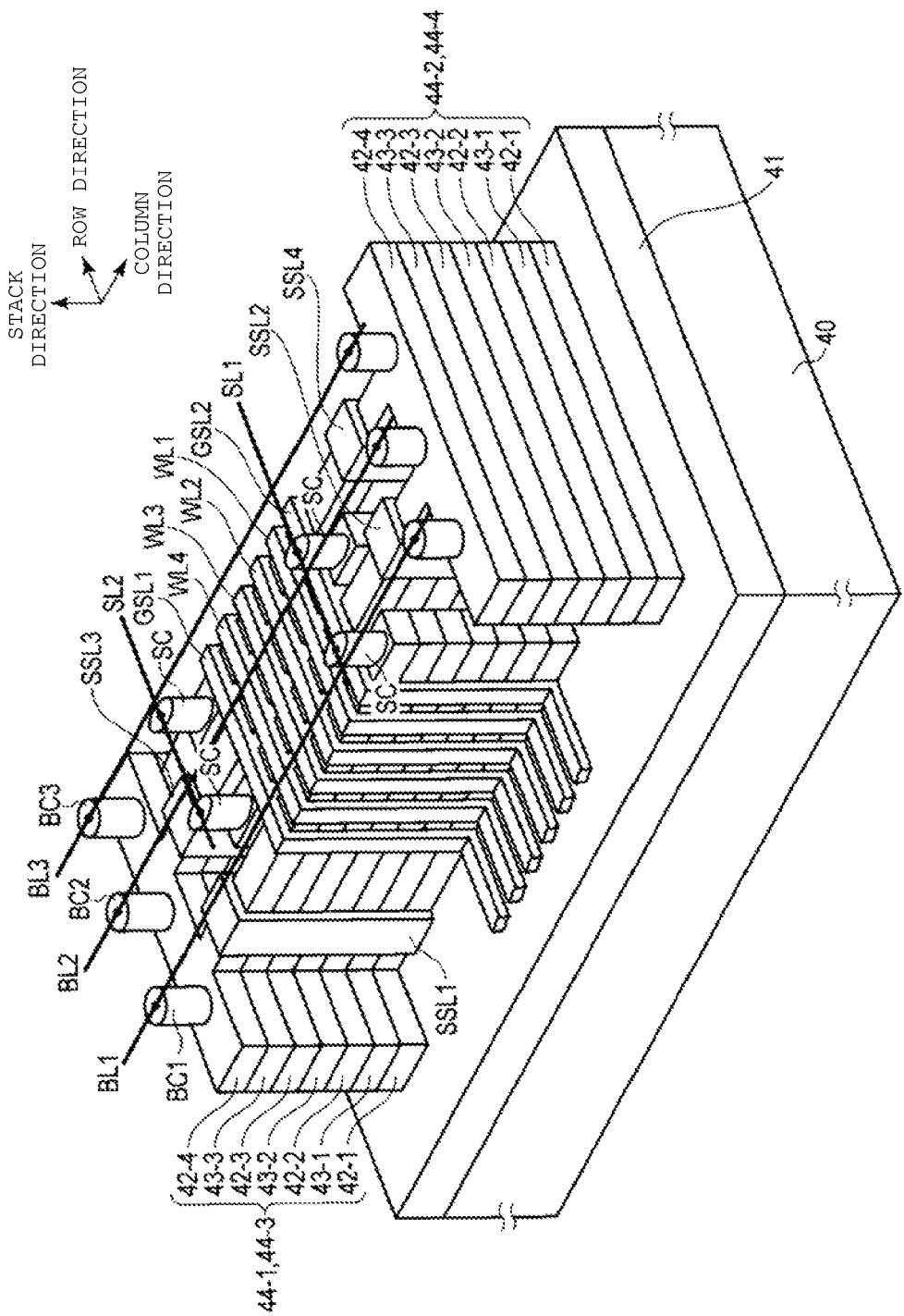
FIG. 19 is a perspective view illustrating the memory cell array of FIG. 18.
Figure 20:
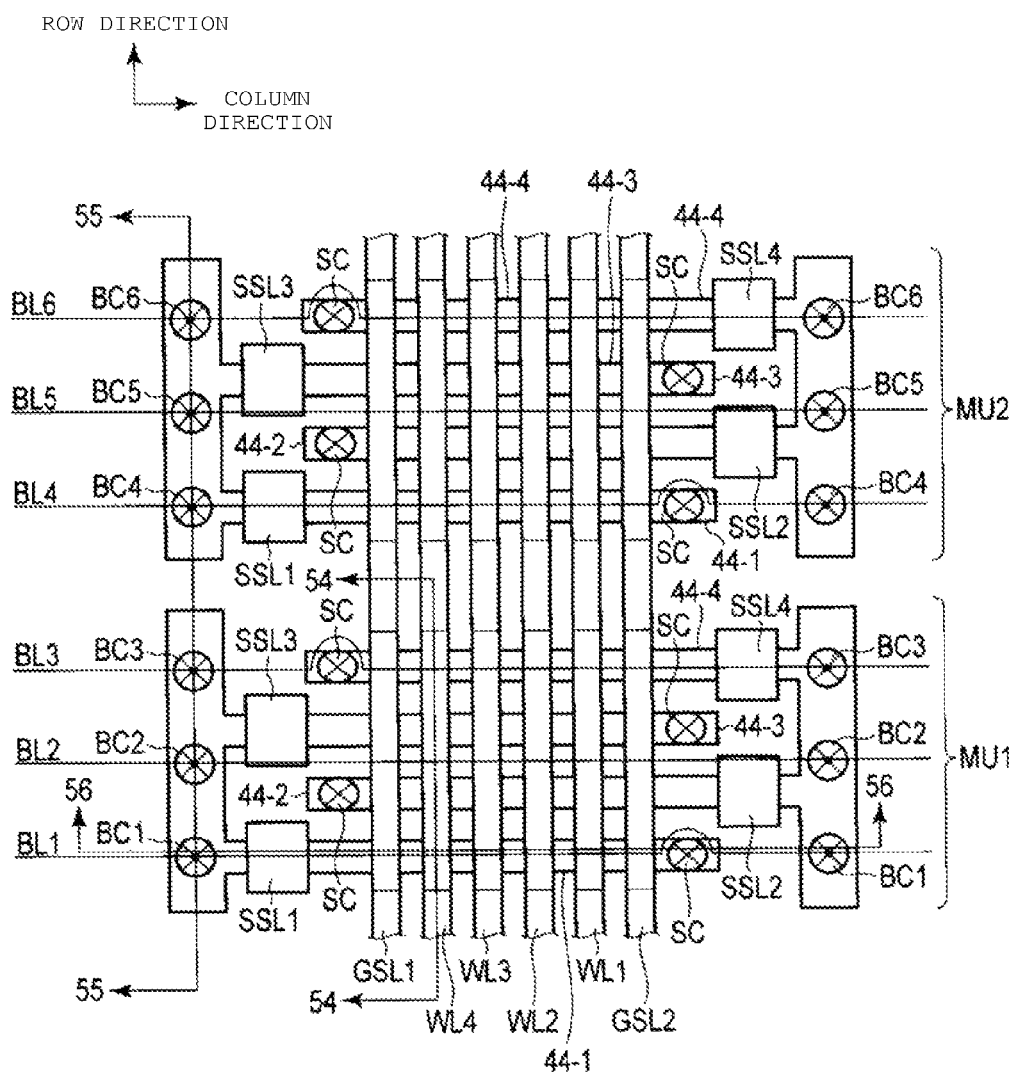
FIG. 20 is a plan view illustrating the memory cell array of FIG. 18.
Figure 21:
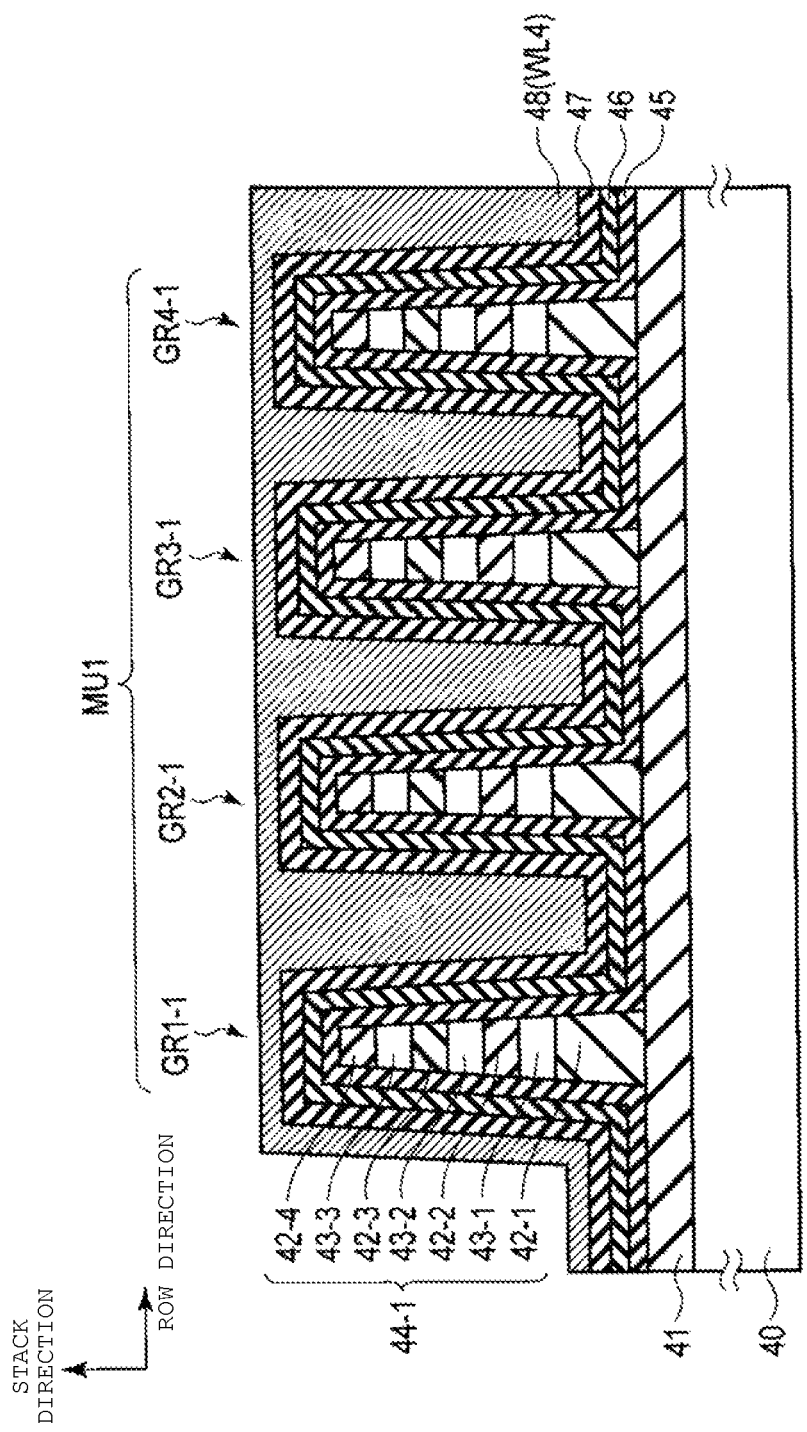
FIG. 21 is a cross-sectional view taken along line 54-54 of FIG. 20.
Figure 22:
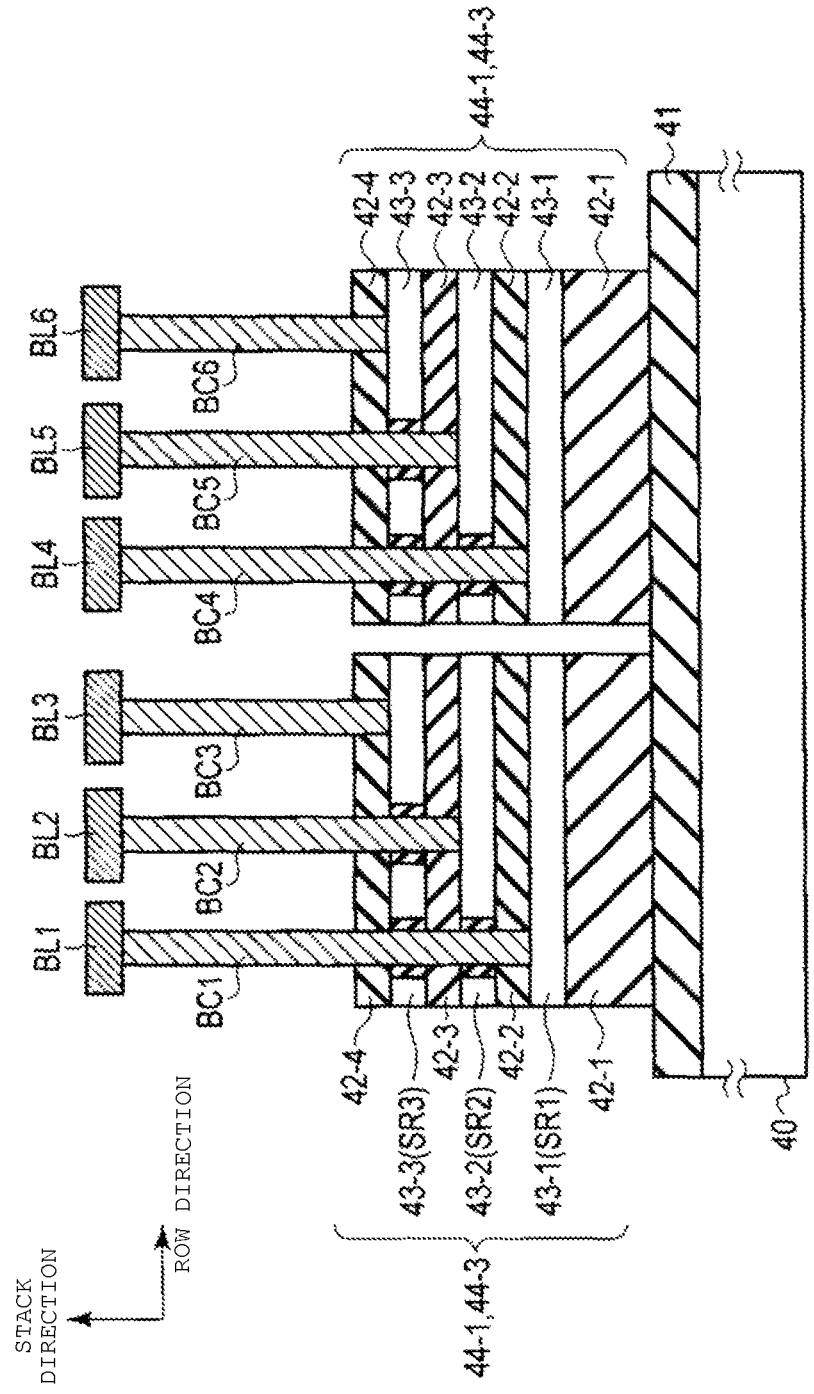
FIG. 22 is a cross-sectional view taken along line 55-55 of FIG. 20.
Figure 23:
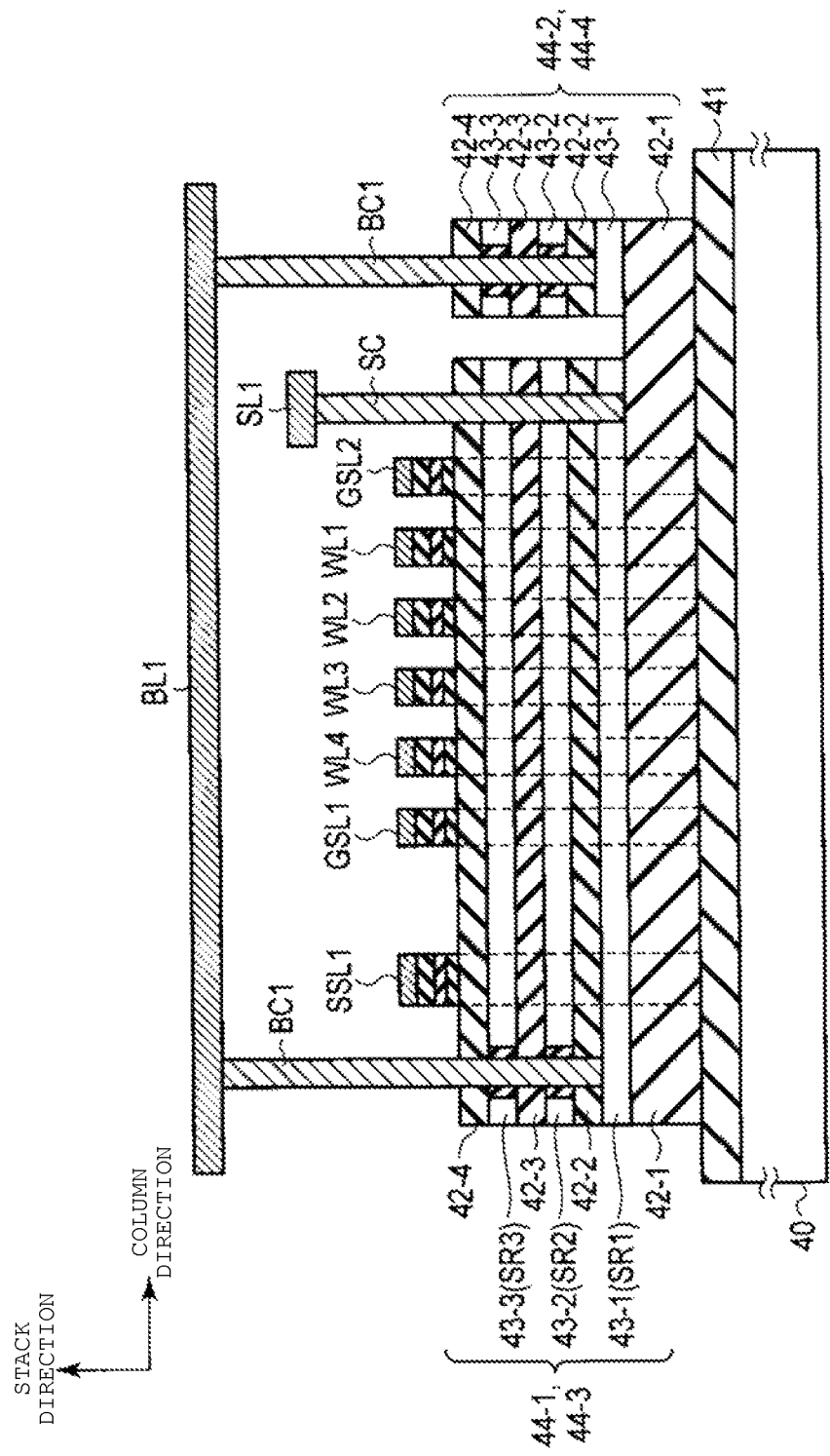
FIG. 23 is a cross-sectional view taken along line 56-56 of FIG. 20.
Figure 24:
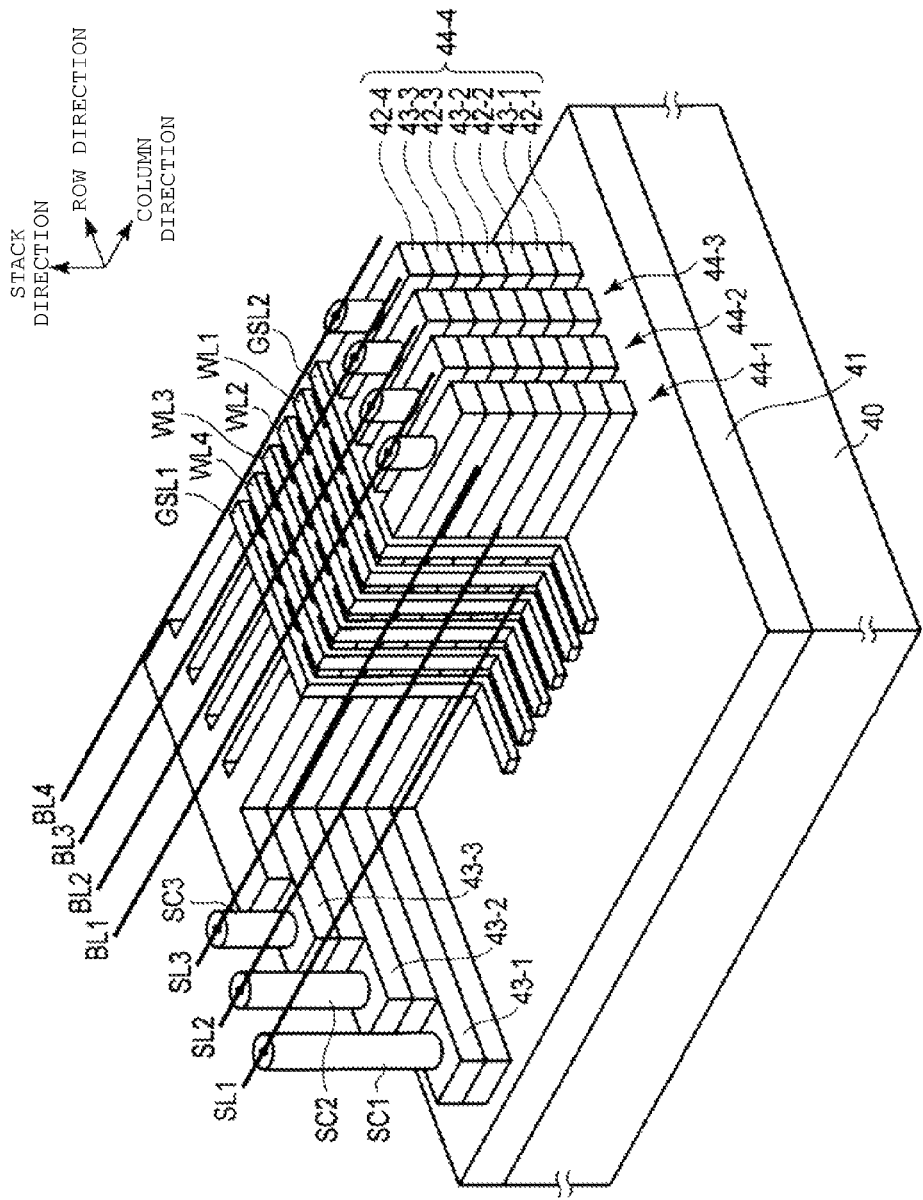
FIG. 24 is a perspective view illustrating a memory cell array according to a modification example of the memory cell array of FIG. 18.
Figure 25:
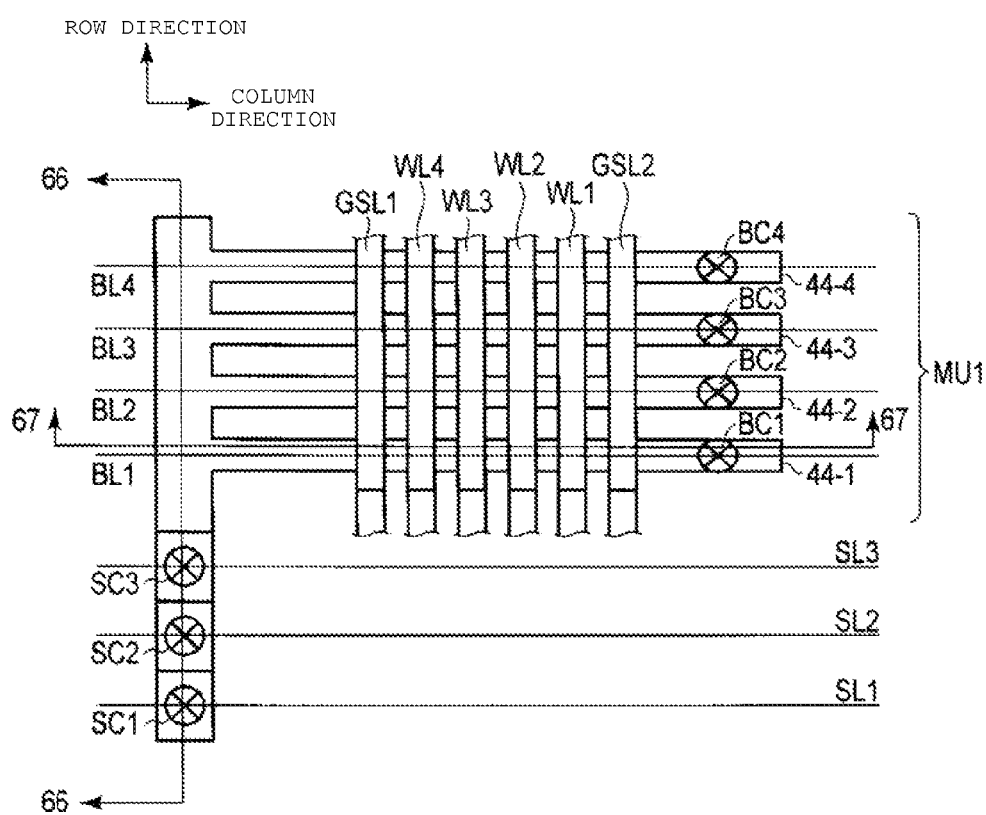
FIG. 25 is a plan view illustrating the memory cell array of FIG. 24.
Figure 26:
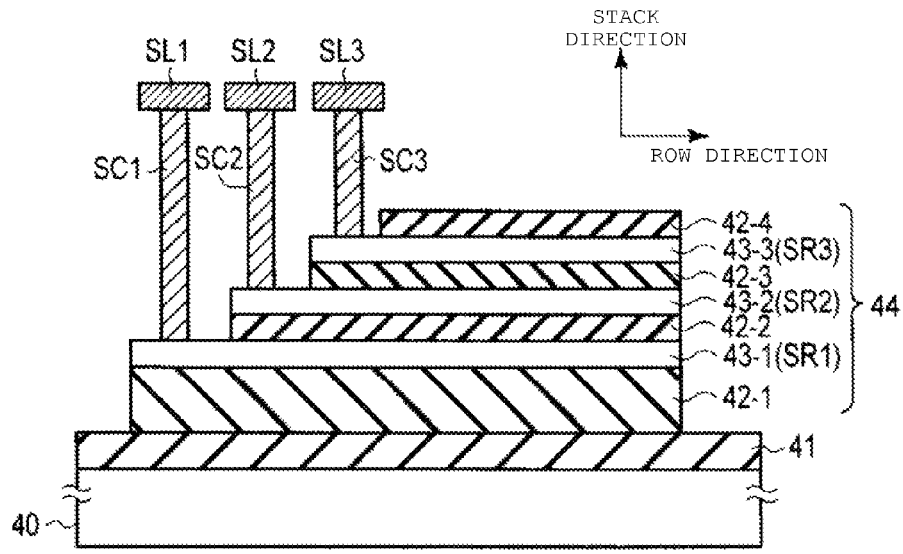
FIG. 26 is a cross-sectional view taken along line 66-66 of FIG. 25.
Figure 27:
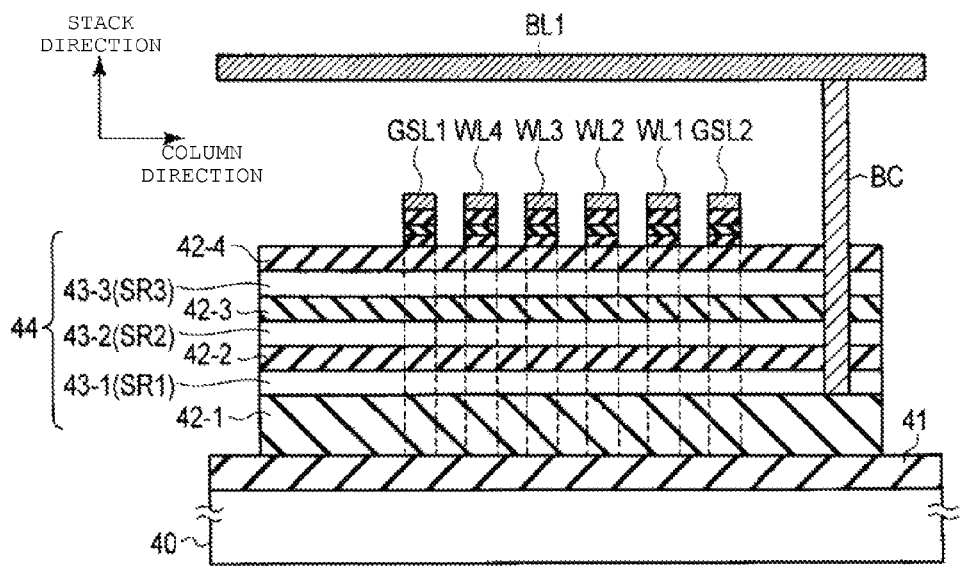
FIG. 27 is a cross-sectional view taken along line 67-67 of FIG. 25.

As illustrated in FIG. 18, a block BLK includes a plurality of memory units MU (MU1, MU2 . . . ). Each memory unit MU includes, for example, four string groups GR (GR1 to GR4). Each of the string groups GR includes, for example, three NAND strings SR (SR1 to SR3). Each of the NAND strings SR includes, for example, selection gate transistors ST1 and ST2, and four memory cell transistors MT (MT1 to MT4).

In the string group GR, three NAND strings SR1 to SR3 are sequentially disposed on the semiconductor substrate. The NAND string SR1 is disposed on a lowermost layer, and the NAND string SR3 is disposed on an uppermost layer. In this manner, in the present embodiment, the memory cell transistors MT within the NAND string SR are disposed in a direction parallel to the surface of the semiconductor substrate, and the NAND strings SR are disposed in a vertical direction.

The odd-numbered string groups GR1 and GR3 and the even-numbered string groups GR2 and GR4 are disposed so that the positional relationship between the selection gate transistors ST1 and ST2 are reversed. In the example of FIG. 18, the selection gate transistor ST1 of the string groups GR1 and GR3 is disposed on the left end of the NAND string SR, and the selection gate transistor ST2 thereof is disposed on the right end of the NAND string SR. The selection gate transistor ST1 of the string groups GR2 and GR4 is disposed on the right end of the NAND string SR, and the selection gate transistor ST2 thereof is disposed on the left end of the NAND string SR.

The gate of the selection gate transistor ST1 of the string groups GR1 and GR3 is connected to a selection gate line GSL1. The gate of the selection gate transistor ST2 of the string groups GR1 and GR3 is connected to a selection gate line GSL2. The gate of the selection gate transistor ST1 of the string groups GR2 and GR4 is connected to the selection gate line GSL2. The gate of the selection gate transistor ST2 of the string groups GR2 and GR4 is connected to the selection gate line GSL1.

A string group GRz included in the memory unit MU1 is connected to bit lines BL1 to BL3 through a column selection gate CSGz ($1 \leq z \leq 4$). In the same string group GR, one end of the selection gate transistor ST1 included in a NAND string SRw is connected to a bit line BLw ($1 \leq w \leq 3$). Similarly, the string group GRz included in the memory unit MU2 is connected to bit lines BL4 to 6 through the column selection gate CSGz ($1 \leq x \leq 4$).

In this manner, the column selection gate CSG selects one string group GR which is connected to the bit line BL, in each memory unit MU. The gate of the column selection gate CSGz which is associated with a certain string group GR is controlled by a control signal line SSLz (1≤z4).

One end of the selection gate transistor ST2 of the string groups GR1 and GR3 is connected to a source line SL1. One end of the selection gate transistor ST2 of the string groups GR2 and GR4 is connected to a source line SL2.

The control gate of the memory cell transistor MT which is located at the same row is connected to the same word line WL.

A plurality of memory units MU having a configuration of FIG. 18 are disposed vertically on the plane of paper of FIG. 18. The plurality of memory units MU share the word line WL and the selection gate lines GSL1 and GSL2. The bit lines BL are independent of each other between the plurality of memory units MU. The number of bit lines BL which are associated with each memory unit MU corresponds to the number of layers of the NAND string SR included in one string group GR. Control signal lines SSL1 to SSL4 may be controlled in common between the memory units MU, or may be controlled independently of each other. In the string group GR selected one by one in each memory unit MU, a set of a plurality of memory cell transistors MT which are connected to the same word line WL becomes a "cell set".

As illustrated in FIGS. 19 to 23, an insulating film 41 is disposed above a semiconductor substrate 40, and the block BLK is disposed above the insulating film 41.

For example, four fin-type structures 44 (44-1 to 44-4) are disposed above the insulating film 41. These fin-type structures 44 have a stripe shape extending a column direction. One memory unit MU includes these fin-type structures 44. Each of the fin-type structures 44 includes insulating films 42 (42-1 to 42-4) and semiconductor layers 43 (43-1 to 43-3).

Each of the fin-type structures 44 corresponds to the string group GR of FIG. 18. A semiconductor layer 43-$w$ corresponds to a region in which the channel of the NAND string SRw illustrated in FIG. 18 is formed (1≤w≤3).

A tunnel insulating layer 45, a charge storage layer 46, a block insulating layer 47, and a control gate 48 are sequentially disposed on the upper surface and the lateral side of the fin-type structure 44. The control gate 48 functions as the word line WL or the selection gate lines GSL1 and GSL2. The word line WL and the selection gate lines GSL1 and GSL2 are disposed so as to extend along a plurality of fin-type structures 44 between a plurality of memory units MU. The control signal lines SSL1 to SSL4 are independent of each other for each of the individual fin-type structures 44.

For example, in the memory unit MU1, one end of the fin-type structure 44 is extracted to the end of the block BLK. Contact plugs BC (BC1 to BC3) are disposed in the extracted region. A contact plug BCw connects the semiconductor layer 43-$w$ and the bit line BLw. Similarly, in the memory unit MU2, connection to the bit line BL through contact plugs BC (BC4 to BC6) is performed.

The contact plug SC is disposed on the other end of the fin-type structure 44. The contact plug SC connects the semiconductor layers 43-1 to 43-3 and the source line SL.

In the configuration of FIGS. 18 to 23, the effects of the embodiment and the modification example mentioned above are also exhibited.

(2) Modification Example According to the Present Embodiment

A semiconductor memory device according to a modification example of the present embodiment will be described with reference to FIGS. 24 to 27. This modification example is different from that in the above-mentioned embodiment, in that the NAND strings SR1 to SR3 are selected by the source line SL.

As illustrated in FIGS. 24 to 27, in a NAND type flash memory of this modification example, one end of each of the plurality of fin-type structures 44 (44-1 to 44-3) is extracted to the end of the block BLK, and is connected to the bit line BL in the extracted region. The bit line BLw is connected to in common to the semiconductor layers 43-1 to 43-3 in a fin-type structure 44-$w$. The other end of each of the plurality of fin-type structures 44 is connected in common, and is connected to the source line SL. A source line SLw is provided independently with respect to the semiconductor layer 43-$w$ in the fin-type structures 44-1 to 44-3 which are connected in common (1≤w≤3). In this example, the control signal line SSL is removed.

Other Embodiments

In the embodiment and the modification example mentioned above, a description is given of an example in which the writing operations are performed in units of a block targeting the cell set which is associated with all the word lines WL within the block BLK, but there is no limitation thereto. The number of cell sets to be written may be larger or smaller than the number of cell sets included in within the block.

In addition, two or more cell sets to be written by one writing operation may be preferably present, and the first and second cell sets may be included. In each program, a third cell set which is written during writing of the first and second cell sets may be included.

In the embodiment and the modification example mentioned above, the NAND string 118 is formed in an I-shape, but there is not limitation thereto. For example, the NAND string may be formed in a U-shape in which a pair of silicon pillars are coupled to each other. A flat NAND string having a MONOS (Metal-Oxide-Nitride-Oxide-Silicon) structure may be used.

Besides, the configuration of the memory cell array may be as disclosed in, for example, U.S. Patent Application Publication No. 2009/0267128 (U.S. patent application Ser. No. 12/407,403) entitled "THREE DIMENSIONAL STACKED NONVOLATILE SEMICONDUCTOR MEMORY". In addition, the configuration may be as disclosed in U.S. Patent Application Publication No. 2009/0268522 (U.S. patent application Ser. No. 12/406,524) entitled "THREE DIMENSIONAL STACKED NONVOLATILE SEMICONDUCTOR MEMORY", U.S. Patent Application Publication No. 2010/0207195 (U.S. patent application Ser. No. 12/679,991) entitled "NON-VOLATILE SEMICONDUCTOR STORAGE DEVICE AND METHOD OF MANUFACTURING THE SAME", and U.S. Patent Application Publication No. 2011/0284946 (U.S. patent application Ser. No. 12/532,030) entitled "SEMICONDUCTOR MEMORY AND METHOD FOR MANUFACTURING THE SAME". These patent applications are incorporated in this specification by reference in their entireties.

In the above-mentioned embodiments and the like, the storage system of the memory cell may be a binary storage system, a multi-valued memory system, and the like. Examples of a read operation, a writing operation, and an erase operation in the memory cell of the multi-valued memory system will be described below in detail.

For example, in a multi-level read operation, a threshold voltage is set to an A level, a B level, a C level, and the like, in order of increasing voltage. In such a read operation, a voltage which is applied to a word line selected in the read operation of the A level is, in the range of, for example, 0 V to 0.55 V. The voltage may be in any range of 0.1 V to 0.24 V, 0.21 V to 0.31 V, 0.31 V to 0.4 V, 0.4 V to 0.5 V, 0.5 V to 0.55 V, and the like, without being limited thereto. A voltage which is applied to a selected word line in the read operation of the B level is in the range of, for example, 1.5 V to 2.3 V. The voltage may be in any range of 1.65 V to 1.8 V, 1.8 V to 1.95 V, 1.95 V to 2.1 V, 2.1 V to 2.3 V, and the like, without being limited thereto. A voltage which is applied to a selected word line in the read operation of the C level is in the range of, for example, 3.0 V to 4.0 V. The voltage may be in any of range of 3.0 V to 3.2 V, 3.2 V to 3.4 V, 3.4 V to 3.5V, 3.5V to 3.6V, 3.6V to 4.0 V, and the like, without being limited thereto. A time (tR) of the read operation may be in any range of, for example, 25 µs to 38 µs, 38 µs to 70 µs, 70 µs to 80 µs, and the like.

The writing operation includes a program operation and a verify operation. In the writing operation, a voltage which is initially applied to a word line selected during the program operation is in the range of, for example, 13.7 V to 14.3 V. The voltage may be in any of, for example, 13.7 V to 14.0 V, 14.0 V to 14.6 V, and the like, without being limited thereto. A voltage which is initially applied to the selected word line during writing of odd-numbered word lines and a voltage which is initially applied to the selected word line during writing of even-numbered word lines may be set to be different from each other. When the program operation is set to an ISPP (Incremental Step Pulse Program) system, a step-up voltage includes, for example, substantially 0.5 V. A voltage which is applied to a non-selected word line may be in the range of, for example, 6.0 V to 7.3 V. The voltage may be in the range of, for example, 7.3 V to 8.4 V without being limited thereto, and may be equal to or less than 6.0 V. Pass voltages to be applied may be set to be different from each other depending on whether the non-selected word line is an odd-numbered word line or an even-numbered word line. A time (tProg) of the writing operation may be in the range of, for example, 1,700 µs to 1,800 µs, 1,800 µs to 1,900 µs, and 1,900 µs to 2,000 µs.

In the erase operation, a voltage which is initially applied to a well, disposed on the semiconductor substrate, which has a memory cell disposed thereon is in the range of, for example, 12 V to 13.6 V. The voltage may be in any range of, for example, 13.6 V to 14.8 V, 14.8 V to 19.0 V, 19.0 V to 19.8 V, 19.8 V to 21 V, and the like, without being limited thereto. The time (tErase) of the erase operation may be in the range of, for example, 3,000 µs to 4,000 µs, 4,000 µs to 5,000 µs, and 4,000 µs to 9,000 µs.

In addition, the memory cell may have, for example, the following structure. The memory cell includes a charge storage film which is disposed on a semiconductor substrate such as a silicon substrate through a tunnel insulating film having a thickness of 4 nm to 10 nm. This charge storage film may be formed to have a stacked structure of an insulating film such as a silicon nitride (SiN) film or a silicon oxynitride (SiON) film having a thickness of 2 nm to 3 nm, and a polysilicon (Poly-Si) film having a thickness of 3 nm to 8 nm. A metal such as ruthenium (Ru) may be added to the polysilicon film. The memory cell includes an insulating film on the charge storage film. The insulating film includes a silicon oxide ($SiO_2$) film having a thickness of 4 nm to 10 nm which is interposed between a lower-layer High-k film having, for example, a thickness of 3 nm to 10 nm and an upper-layer High-k film having a thickness of 3 nm to 10 nm. Materials of the High-k film include hafnium oxide (HfO) and the like. In addition, the thickness of the silicon oxide film may be made to be larger than the thickness of the High-k film. A control electrode having a thickness of 30 nm to 70 nm is provided on the insulating film through a film having a thickness of 3 nm to 10 nm. Here, the work function adjusting film is, for example, a metal oxide film such as tantalum oxide (TaO), a metal nitride film such as tantalum nitride (TaN), or the like. Tungsten (W) or the like may be used in the control electrode. An air gap may be disposed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a memory cell array including a first set of memory cells commonly connected to a first word line, and a second set of memory cells commonly connected to a second word line; and
   a control circuit configured to execute a writing operation on the memory cells, including controlling voltages applied to the first and second word lines, wherein the writing operation includes a coarse program operation and a fine program operation and the control circuit executes the writing operation on the first and second sets of memory cells in a single write operation that includes starting the following operations in order:
   (1) the coarse program operation on the first set of memory cells;
   (2) the coarse program operation on the second set of memory cells;
   (3) the fine program operation on the first set of memory cells; and
   (4) the fine program operation on the second set of memory cells.

2. The device according to claim 1, wherein the coarse program operation performed on the memory cells causes the memory cells to have a threshold distribution that is wider than when the fine program operation is performed on the memory cells.

3. The device according to claim 1, wherein a first memory cell in the first set and a second memory cell in the second set are serially connected between a source side selection transistor and the a drain side selection transistor, and the first memory cell is closer to the source side selection transistor than the second memory cell.

4. The device according to claim 1, wherein the coarse program operation on the second set of memory cells is started prior to completion of the coarse program operation on the first set of memory cells.

5. The device according to claim 4, wherein the fine program operation on the second set of memory cells is started prior to completion of the fine program operation on the first set of memory cells.

6. The device according to claim 1, wherein the fine program operation on the first set of memory cells is started after completion of the coarse program operation on the second set of memory cells.

7. The device according to claim 1, wherein after the single writing operation has terminated, the control unit applies a zero voltage to the first and second word lines.

8. The device according to claim 1, wherein after the single writing operation has terminated, the control unit applies a negative voltage to the first and second word lines.

9. A semiconductor memory device comprising:
- a memory cell array including a first set of memory cells commonly connected to a first word line, and a second set of memory cells commonly connected to a second word line; and
- a control circuit configured to execute a writing operation on the memory cells, including controlling voltages applied to the first and second word lines, wherein the writing operation includes an initial program operation, a coarse program operation and a fine program operation, and the control circuit executes the writing operation on the first and second sets of memory cells in a single write operation that includes performing the initial program operation on the first and second sets of memory cells, and then starting the following operations in order:
    (1) the coarse program operation on the first set of memory cells;
    (2) the coarse program operation on the second set of memory cells;
    (3) the fine program operation on the first set of memory cells; and
    (4) the fine program operation on the second set of memory cells.

10. The device according to claim 9, wherein the initial program operation performed on the memory cells causes the memory cells to have an intermediate threshold distribution.

11. The device according to claim 10, wherein the coarse program operation performed on the memory cells causes the memory cells to have a threshold distribution that is wider than when the fine program operation is performed on the memory cells.

12. The device according to claim 9, wherein a first memory cell in the first set and a second memory cell in the second set are serially connected between a source side selection transistor and the a drain side selection transistor, and the first memory cell is closer to the source side selection transistor than the second memory cell.

13. A method of performing a write operation on first and second sets of memory cells of a semiconductor memory device, wherein the first set of memory cells is commonly connected to a first word line, and the second set of memory cells is commonly connected to a second word line, said method comprising:
- executing a writing operation on the first and second sets of memory cells, including controlling voltages applied to the first and second word lines, as a single write operation that includes starting the following operations in order:
    (1) the coarse program operation on the first set of memory cells;
    (2) the coarse program operation on the second set of memory cells;
    (3) the fine program operation on the first set of memory cells; and
    (4) the fine program operation on the second set of memory cells.

14. The method according to claim 13, wherein the coarse program operation performed on the memory cells causes the memory cells to have a threshold distribution that is wider than when the fine program operation is performed on the memory cells.

15. The method according to claim 13, wherein a first memory cell in the first set and a second memory cell in the second set are serially connected between a source side selection transistor and the a drain side selection transistor, and the first memory cell is closer to the source side selection transistor than the second memory cell.

16. The method according to claim 13, wherein the coarse program operation on the second set of memory cells is started prior to completion of the coarse program operation on the first set of memory cells.

17. The method according to claim 16, wherein the fine program operation on the second set of memory cells is started prior to completion of the fine program operation on the first set of memory cells.

18. The method according to claim 13, wherein the fine program operation on the first set of memory cells is started after completion of the coarse program operation on the second set of memory cells.

19. The method according to claim 13, further comprising:
- after the single writing operation has terminated, applying a zero voltage to the first and second word lines.

20. The method according to claim 13, further comprising:
- after the single writing operation has terminated, applying a negative voltage to the first and second word lines.

* * * * *